US010163868B2

(12) United States Patent
Horio et al.

(10) Patent No.: US 10,163,868 B2
(45) Date of Patent: Dec. 25, 2018

(54) SEMICONDUCTOR DEVICE

(71) Applicant: FUJI ELECTRIC CO., LTD., Kawasaki-shi, Kanagawa (JP)

(72) Inventors: Masafumi Horio, Matsumoto (JP); Yoshinari Ikeda, Matsumoto (JP); Hideyo Nakamura, Matsumoto (JP); Hayato Nakano, Kofu (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/877,445

(22) Filed: Oct. 7, 2015

(65) Prior Publication Data

US 2017/0077068 A1    Mar. 16, 2017

Related U.S. Application Data

(63) Continuation of application No. PCT/JP2014/002498, filed on May 12, 2014.

(30) Foreign Application Priority Data

May 16, 2013   (JP) ................................. 2013-104077
Oct. 28, 2013   (WO) .................. PCT/JP2013/006366

(51) Int. Cl.
  *H01L 25/07*   (2006.01)
  *H01L 23/492*  (2006.01)
  (Continued)

(52) U.S. Cl.
  CPC ............ *H01L 25/072* (2013.01); *H01L 23/12* (2013.01); *H01L 23/3121* (2013.01);
  (Continued)

(58) Field of Classification Search
  None
  See application file for complete search history.

(56) References Cited

U.S. PATENT DOCUMENTS 5,629,240 A * 5/1997 Malladi ................... H01L 23/50
                                                       257/E23.079
2003/0173579 A1* 9/2003 Ishii ....................... H01L 25/072
                                                       257/177
(Continued)

FOREIGN PATENT DOCUMENTS

JP    H08-204065 A    8/1996
JP    H09-045828 A    2/1997
(Continued)

OTHER PUBLICATIONS

PCT, "International Search Report for International Application No. PCT/JP2014/002498".

*Primary Examiner* — Michael Lebentritt
*Assistant Examiner* — Jordan Klein
(74) *Attorney, Agent, or Firm* — Manabu Kanesaka

(57) ABSTRACT

A semiconductor device includes an insulating substrate having an insulating plate and a circuit plate; a semiconductor chip having a front surface provided with a gate electrode and a source electrode, and a rear surface fixed to the circuit plate; a printed circuit board facing the insulating substrate, and including a first metal layer and a second metal layer; a first conductive post having two ends electrically and mechanically connected to the gate electrode and the first metal layer; a second conductive post having two ends electrically and mechanically connected to the source electrode and the second metal layer; and a circuit impedance reducing element electrically connected between the gate electrode and the source electrode through the first conductive post and the second conductive post.

16 Claims, 15 Drawing Sheets

(51) Int. Cl.
*H01L 23/498* (2006.01)
*H01L 23/64* (2006.01)
*H01L 23/373* (2006.01)
*H01L 23/00* (2006.01)
*H01L 25/18* (2006.01)
*H01L 23/12* (2006.01)
*H01L 29/739* (2006.01)
*H01L 29/78* (2006.01)
*H01L 23/31* (2006.01)

(52) U.S. Cl.
CPC ........ *H01L 23/3735* (2013.01); *H01L 23/492* (2013.01); *H01L 23/49811* (2013.01); *H01L 23/49838* (2013.01); *H01L 23/64* (2013.01); *H01L 24/01* (2013.01); *H01L 24/32* (2013.01); *H01L 25/18* (2013.01); *H01L 29/7395* (2013.01); *H01L 29/7827* (2013.01); *H01L 23/3107* (2013.01); *H01L 24/06* (2013.01); *H01L 2224/06181* (2013.01); *H01L 2224/32225* (2013.01); *H01L 2224/32245* (2013.01); *H01L 2224/48137* (2013.01); *H01L 2224/48139* (2013.01); *H01L 2224/73265* (2013.01); *H01L 2924/1203* (2013.01); *H01L 2924/1305* (2013.01); *H01L 2924/13055* (2013.01); *H01L 2924/13091* (2013.01); *H01L 2924/15787* (2013.01); *H01L 2924/19041* (2013.01); *H01L 2924/19105* (2013.01); *H01L 2924/3011* (2013.01)

(56) References Cited

U.S. PATENT DOCUMENTS

| | | | | |
|---|---|---|---|---|
| 2004/0041201 | A1* | 3/2004 | Sugiyama | H01L 23/49844 257/316 |
| 2009/0246910 | A1* | 10/2009 | Taniguchi | H01L 23/5385 438/107 |
| 2010/0007026 | A1* | 1/2010 | Shikano | H01L 24/49 257/773 |
| 2012/0241953 | A1* | 9/2012 | Yamada | H01L 23/4334 257/737 |
| 2014/0346676 | A1* | 11/2014 | Horio | H01L 25/18 257/773 |
| 2015/0130071 | A1* | 5/2015 | Hohlfeld | H01L 25/074 257/774 |
| 2015/0223339 | A1* | 8/2015 | Nakamura | H01L 23/3735 361/705 |
| 2015/0380393 | A1* | 12/2015 | Nakamura | H01L 24/01 361/782 |
| 2016/0219689 | A1* | 7/2016 | Nakamura | H01L 25/162 |

FOREIGN PATENT DOCUMENTS

| | | |
|---|---|---|
| JP | 2000-243905 A | 9/2000 |
| JP | 2004-014547 A | 1/2004 |
| JP | 2004-228403 A | 8/2004 |
| JP | 2006-121861 A | 5/2006 |
| JP | 2009-064852 A | 3/2009 |
| JP | 2009-231690 A | 10/2009 |
| JP | 2010-021338 A | 1/2010 |
| JP | 2012-119618 A | 6/2012 |

* cited by examiner

Prior Art

SEMICONDUCTOR DEVICE

CROSS-REFERENCES TO RELATED APPLICATIONS

The present application is a Continuation application of PCT International Application No. PCT/JP2014/002498 filed May 12, 2014, and claiming priority from Japanese Application No. 2013-104077 filed May 16, 2013, and PCT International Application No. PCT/JP2013/006366 filed Oct. 28, 2013, the disclosure of which is incorporated herein.

TECHNICAL FIELD

The present invention relates to a semiconductor device, such as a switching IC for a power device or a high frequency, and more particularly, to a semiconductor device including a power semiconductor element.

BACKGROUND ART

A semiconductor device (power semiconductor module) has been used independently of a main device in, for example, an inverter apparatus, an uninterruptible power system, a machine tool, and an industrial robot.

For example, a power semiconductor module illustrated in FIG. 17 has been proposed as a power semiconductor module according to the related art.

A two-in-one power semiconductor module 100 is given as an example of the power semiconductor module according to the related art.

In the power semiconductor module 100, an insulating substrate 102 is bonded to a base plate 101 for radiation by solder 103. The insulating substrate 102 includes an insulating plate 102a, a circuit plate 102b which is fixed to a front surface of the insulating plate 102a, and a metal plate 102c which is fixed to a rear surface of the insulating plate 102a.

A semiconductor chip (power semiconductor element) 104 is fixed to the circuit plate 102b of the insulating substrate 102 by solder 105.

The base plate 101, the insulating substrate 102, and the semiconductor chip 104 are provided in a resin case 106 having a box shape with an opened lower end. The resin case 106 is filled with a sealing resin. In addition, reference numeral 107 indicates an external terminal which is soldered to the circuit plate 102b and reference numeral 108 indicates a bonding wire which connects the semiconductor chips 104 or a bonding wire which connects the semiconductor chip 104 and the circuit plate 102b.

As another example of the semiconductor device according to the related art, a semiconductor device has been proposed in which a plurality of conductive posts is fixed to a printed circuit board including a metal layer and the conductive posts are fixed to a semiconductor chip on an insulating substrate or a circuit plate of the insulating substrate (Patent Documents 1 and 2).

In addition, a semiconductor device has been proposed in which a capacitor is additionally provided between the gate and emitter of a switching element to prevent the switching element from being unintentionally turned on (Patent Document 3).

CITATION LIST

Patent Document

Patent Document 1: JP 2009-64852 A
Patent Document 2: JP 2004-228403 A
Patent Document 3: JP 2000-243905 A

DISCLOSURE OF THE INVENTION

Problem to be Solved by the Invention

However, in the semiconductor device 100 illustrated in FIG. 17, since the bonding wire 108 is used, it is difficult to reduce the inductance of a line in the semiconductor device. Therefore, it is difficult to switch the semiconductor chip 104 in the semiconductor device 100 at a high speed. In addition, the circuit plate 102b having a wiring pattern connected to the bonding wire should be provided on the insulating substrate 102, which makes it difficult to reduce the size of the semiconductor device.

In the semiconductor devices disclosed in Patent Documents 1 and 2, the bonding wire is short and the conductive post having a large cross-sectional area is used. Therefore, it is possible to reduce the inductance of the line in the semiconductor device. In addition, it is possible to form a multi-layer circuit of the insulating substrate and the printed circuit board and thus reduce the size of the semiconductor device. However, the structure is insufficient to make a high-speed switching element, which is typified by a SiC semiconductor element, sufficiently fulfill its performance.

In the semiconductor device disclosed in Patent Document 3, the switching element and the circuit plate are connected to each other by the bonding wire. Therefore, the inductance of the line in the semiconductor device is large and the current bypass effect obtained by the capacitor is reduced, which makes it difficult to effectively prevent the switching element from being unintentionally turned on.

The invention has been made in view of the above-mentioned problems and an object of the invention is to provide a semiconductor device in which an excellent current bypass effect is obtained by a circuit impedance reducing element.

Means for Solving Problem

In order to achieve the object, according to a first aspect of the invention, there is provided a semiconductor device including: an insulating substrate including an insulating plate and a circuit plate; a semiconductor chip that has a front surface on which a gate electrode and a source electrode are provided and a rear surface which is fixed to the circuit plate; a printed circuit board that includes a first metal layer and a second metal layer and faces the insulating substrate; a first conductive post having both ends which are electrically and mechanically connected to the gate electrode and the first metal layer; a second conductive post having both ends which are electrically and mechanically connected to the source electrode and the second metal layer; and a circuit impedance reducing element that is electrically connected between the gate electrode and the source electrode through the first conductive post and the second conductive post.

According to a second aspect of the invention, there is provided a semiconductor device including: an insulating substrate including an insulating plate and a circuit plate; a semiconductor chip that has a front surface on which a gate electrode and a source electrode are provided and a rear surface which is fixed to the circuit plate; a printed circuit board that includes a first metal layer and a second metal layer and faces the insulating substrate; a first conductive post having both ends which are electrically and mechanically connected to the gate electrode and the first metal layer; a second conductive post having both ends which are electrically and mechanically connected to the source electrode and the second metal layer; and an element connection terminal that is structured to connect a circuit impedance reducing element between the gate electrode and the source electrode through the first conductive post and the second conductive post.

Effect of the Invention

According to the invention, the gate line and the source line connected to the semiconductor chip are formed by the conductive post and the printed circuit board. Therefore, it is possible to reduce the inductance of internal lines, without increasing the size of the semiconductor device. In addition, the circuit impedance reducing element is electrically connected between the gate electrode and the source electrode of the semiconductor chip through the conductive post. Therefore, it is possible to effectively obtain the current bypass effect of the circuit impedance reducing element. As a result, it is possible to suppress the oscillation of a gate electrode voltage in the semiconductor chip and to reliably prevent the semiconductor chip from being unintentionally turned on.

MODE(S) FOR CARRYING OUT THE INVENTION

Hereinafter, embodiments of the invention will be described with reference to the drawings.

The term "electrically and mechanically connected" used in the application is not limited to a case in which objects are connected to each other by direct bonding and includes a case in which objects are connected to each other through a conductive bonding material such as solder or a sintered metal material.

Figure 1:
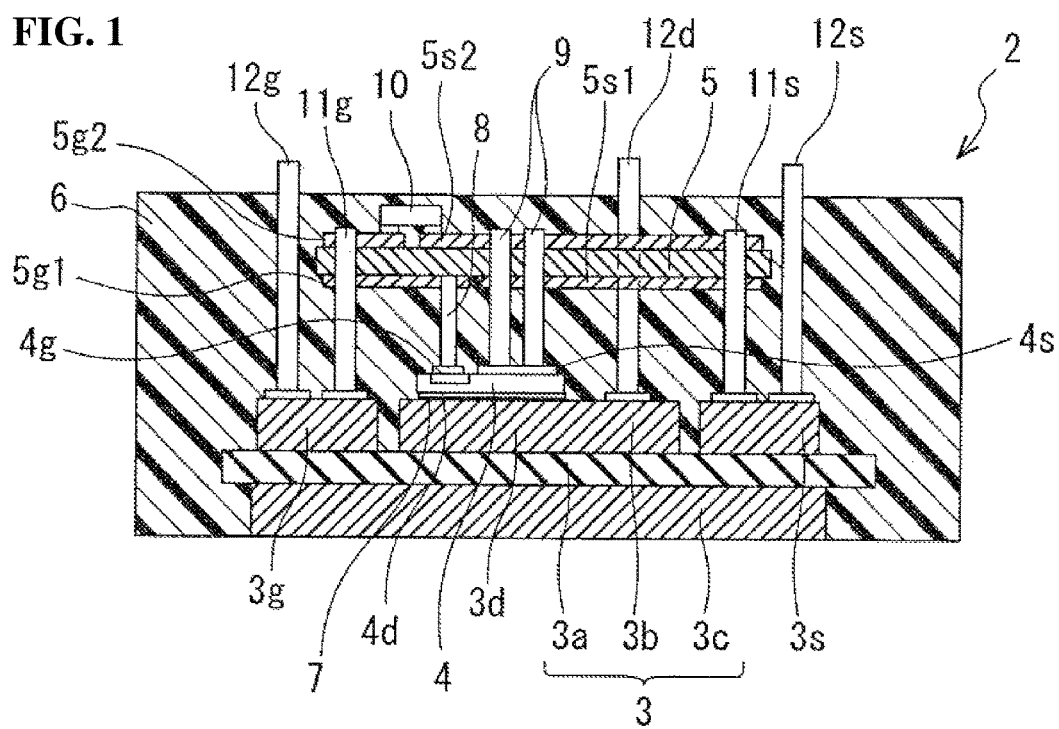
FIG. 1 is a cross-sectional view illustrating a main portion of a first embodiment of a semiconductor device according to the invention.

FIG. 1 is a cross-sectional view illustrating the schematic structure of a first embodiment of a semiconductor device according to the invention.

FIG. 1 illustrates a power semiconductor module 2 as the semiconductor device according to the invention. The power semiconductor module 2 includes an insulating substrate 3, a semiconductor chip 4, a printed circuit board 5, a first conductive post 8, a second conductive post 9, and a circuit impedance reducing element 10.

The insulating substrate 3 includes an insulating plate 3a, a circuit plate 3b which is fixed to a main surface of the insulating plate 3a, and a metal plate 3c which is fixed to a surface of the insulating plate 3a opposite to the main surface. The insulating plate 3a is made of, for example, ceramics and the circuit plate 3b and the metal plate 3c are made of, for example, copper or aluminum. The circuit plate 3b includes a first circuit plate 3g for a gate electrode, a second circuit plate 3s for a source electrode, and a third circuit plate 3d for a drain electrode which are insulated from each other.

The semiconductor chip 4 is fixed to the surface of the circuit plate 3b by a bonding material 7 such as solder. The semiconductor chip 4 includes a switching power semiconductor element such as a power MOSFET or an insulated gate bipolar transistor (IGBT). In the description of the embodiment in the specification, it is assumed that the semiconductor chip 4 is a power MOSFET.

A printed circuit board 5 is provided so as to face the surface of the insulating substrate 3 to which the circuit plate 3b is fixed. The printed circuit board 5 includes first metal layers 5g1 and 5g2 and second metal layers 5s1 and 5s2 which are made of, for example, copper. The first metal layers 5g1 and 5g2 are used for a gate line and the second metal layers 5s1 and 5s2 are used for a source line. The first metal layers 5g1 and 5g2 are electrically connected to each other by, for example, a conductive post buried in a through hole. The second metal layers 5s1 and 5s2 are electrically connected to each other by the same method as described above.

The circuit plate 3b, the semiconductor chip 4, and the printed circuit board 5 are sealed by an insulating resin 6. The metal plate 3c of the insulating substrate 3 is exposed from the insulating resin 6. The insulating resin 6 is, for example, an epoxy resin which is a thermosetting resin.

The semiconductor chip 4 includes a gate electrode 4g and a source electrode 4s which are provided on the front surface and a drain electrode 4d which is provided on the rear surface. The drain electrode 4d is electrically and mechanically connected to the third circuit plate 3d by the bonding material 7.

The first conductive post 8 and the second conductive post which have a columnar shape are provided between the insulating substrate 3 and the printed circuit board 5. Both ends of the first conductive post 8 are electrically and mechanically connected to the gate electrode 4g and the first metal layer 5g1. In addition, both ends of the second conductive post 9 are electrically and mechanically connected to the source electrode 4s and the second metal layer 5s1.

The first metal layers 5g1 and 5g2 are electrically connected to the first circuit plate 3g through a conductive post 11g. In addition, an external terminal 12g for a gate electrode is electrically and mechanically connected to the first circuit plate 3g.

The second metal layers 5s1 and 5s2 are electrically connected to the second circuit plate 3s through a conductive post 11s. In addition, an external terminal 12s for a source electrode is electrically and mechanically connected to the second circuit plate 3s.

An external terminal 12d for a drain electrode is electrically and mechanically connected to the third circuit plate 3d. In addition, the ends of the external terminals 12g, 12s, and 12d which are opposite to the ends connected to the circuit plate 3b protrude from the insulating resin 6.

The capacitor 10 serving as a circuit impedance reducing element is electrically and mechanically connected between the first metal layer 5g2 and the second metal layer 5s2.

Figure 2:
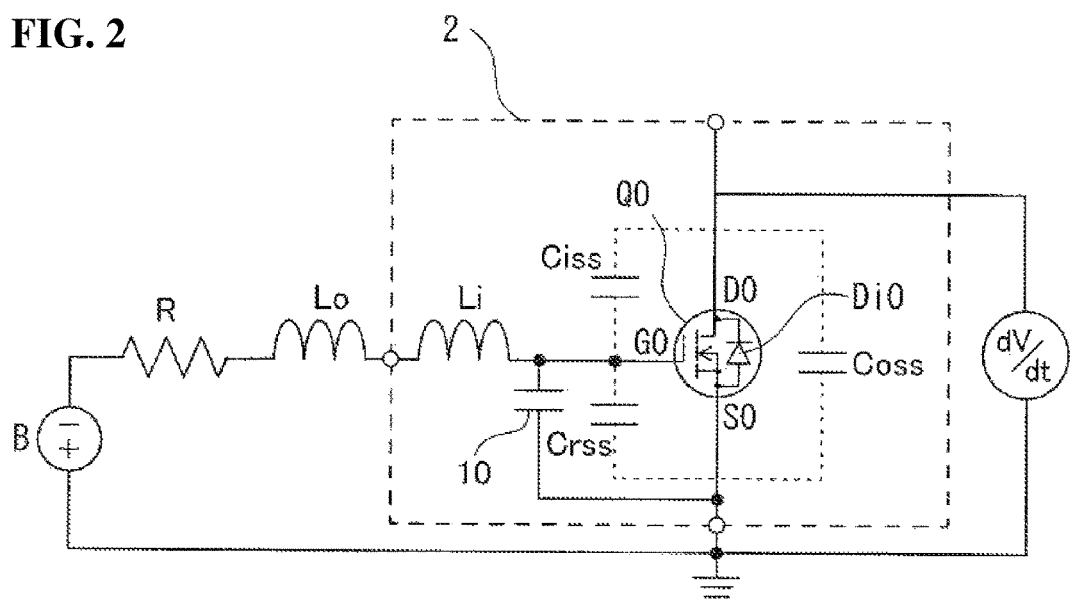
FIG. 2 is a circuit diagram illustrating an equivalent circuit of the first embodiment.

FIG. 2 illustrates an equivalent circuit of the power semiconductor module 2 according to the first embodiment.

A gate electrode G0 of a MOSFET Q0 is connected to a negative electrode of a bias power supply B through a gate resistance R and gate line inductances Li and Lo. A source electrode S0 is connected to a positive electrode of the bias power supply B and the ground. A parasitic diode Di0 is connected in inverse parallel between the drain D0 and the source S0 of the MOSFET Q0. In addition, the capacitor 10 which is the circuit impedance reducing element is connected between the gate G0 and the source S0 of the MOSFET Q0.

In addition, in the MOSFET Q0, a parasitic input capacitance Ciss is generated between the gate electrode and the drain electrode, a parasitic feedback capacitance (reverse transfer capacitance) Crss is generated between the gate electrode and the source electrode, and a parasitic output capacitance Coss is generated between the drain electrode and the source electrode.

When the semiconductor chip 4 including the MOSFET Q0 is turned off, a current oscillates due to the resonance among a current Ig which flows to the gate G0, the inductance Lg (Lo+Li) of the gate line, and the gate resistance R. In some cases, when the current oscillates, a gate voltage increases so as to be equal to or greater than a threshold value and the MOSFET Q0 which is originally in an off state is unintentionally turned on.

It is effective to connect the circuit impedance reducing element (here, the capacitor 10) with a current bypass effect between the gate and source of the MOSFET Q0 in order to prevent the MOSFET Q0 from being unintentionally turned on. In addition, it was found that a reduction in the inductance of the gate line was effective in improving the current bypass effect of the circuit impedance reducing element. The inductance of the gate line is represented by the sum of the inductance Li of the line in the power semiconductor module 2 and the inductance Lo of the line in the gate driving circuit. Therefore, it is effective to minimize the inductance Li of the line in the power semiconductor module 2.

However, when a bonding wire is used as the gate line, the inductance Li of the line in the power semiconductor module is reduced only to, for example, 20 nH to 40 nH.

In contrast, as in this embodiment, when the first conductive post 8, the conductive post 11g, and the first metal layers 5g1 and 5g2 are used as the gate line, it is possible to suppress the inductance Li of the line to, for example, 5 nH to 10 nH. That is, the inductance Li of the line can be reduced to one-fourth to one-eighth of the inductance of the line when the bonding wire is used as the gate line.

Therefore, according to this embodiment, it is possible to effectively obtain the current bypass effect of the circuit impedance reducing element (capacitor 10). Therefore, it is possible to prevent the MOSFET Q0 from being unintentionally turned on and to expand the range of the value of di/dt or dV/dt in which the MOSFET Q0 can be used.

Next, a second embodiment of the invention will be described with reference to FIGS. 1 and 3.

In the second embodiment, two power semiconductor modules 2 according to the first embodiment illustrated in FIG. 1 are connected in series to form a bridge circuit. FIG. 3 illustrates an equivalent circuit.

Figure 3:
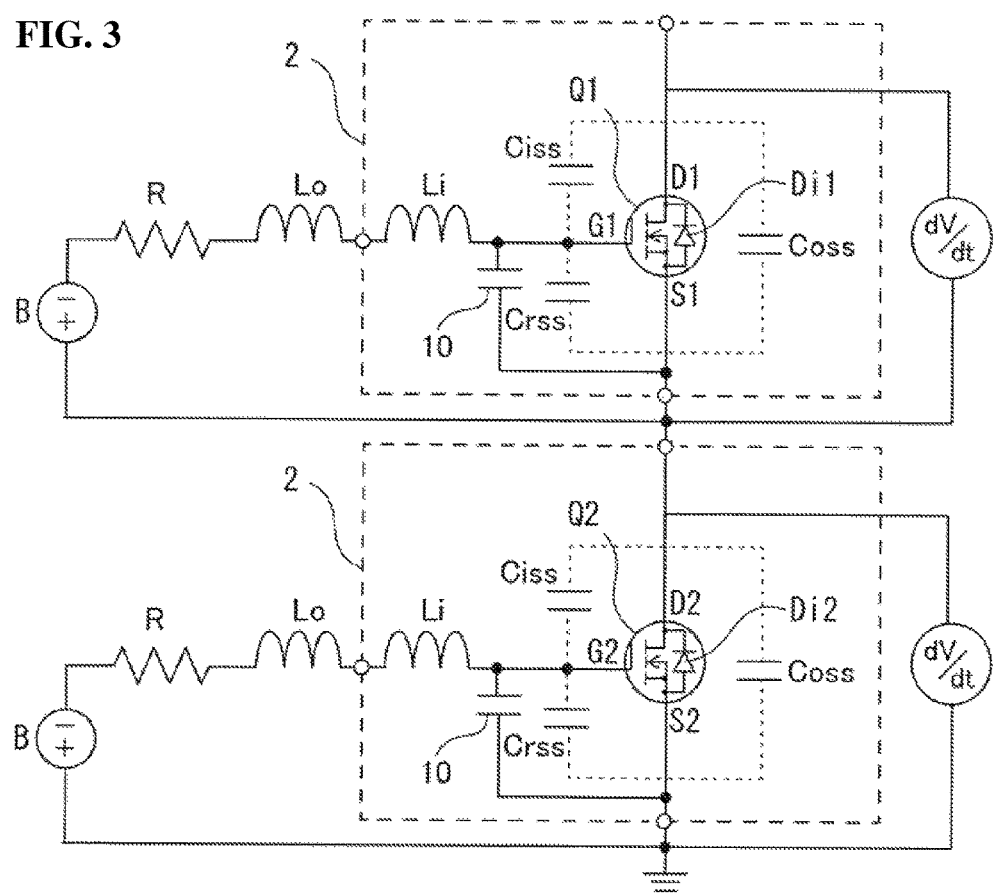
FIG. 3 is a circuit diagram illustrating an equivalent circuit of a second embodiment.

That is, in the second embodiment, as illustrated in FIG. 3, a drain electrode D1 of a MOSFET Q1 in the power semiconductor module 2 forming an upper arm is connected to a DC power supply (not illustrated). A source electrode S1 of the MOSFET Q1 is connected to a drain electrode D2 of a MOSFET Q2 in the power semiconductor module 2 forming a lower arm. A source electrode S2 of the MOSFET Q2 is grounded.

When the MOSFET Q1 of the upper arm is turned on with the MOSFET Q2 of the lower arm turned off, a parasitic diode Dig in the MOSFET Q2 of the lower arm is reversely recovered and the drain voltage of the lower arm rapidly increases. A current which is the product of the increasing gradient of the voltage (dV/dt) and the feedback capacitance Crss of the MOSFET Q2 of the lower arm increases the gate potential of the MOSFET Q2. When the gate potential of the MOSFET Q2 is higher than a threshold voltage, the MOSFET Q2 is unintentionally turned on. That is, since the MOSFETs Q1 and Q2 are both turned on, the bridge circuit is short-circuited. This will be described in detail below.

In the MOSFET Q2, a parasitic input capacitance Ciss is generated between a gate electrode and a drain electrode, a parasitic feedback capacitance (reverse transfer capacitance) Crss is generated between the gate electrode and a source electrode, and a parasitic output capacitance Coss is generated between the drain electrode and the source electrode. Therefore, the gate resistance R, the inductances Li and Lo of the gate line, the parasitic capacitances Ciss and Crss are connected to the gate electrode and a series RLC circuit is formed. Therefore, a potential variation ΔVg occurs due to the oscillation of the series RLC circuit.

When the sum (Vg+ΔVg) of a gate potential Vg and the potential variation ΔVg is greater than a threshold voltage Vth, the MOSFET Q2 is unintentionally turned on and the upper and lower arms are short-circuited.

It was found that the connection of the circuit impedance reducing element (here, the capacitor 10) between the gate and the source of the MOSFET Q2 was effective in preventing the MOSFET Q2 of the lower arm from being unintentionally turned on. This is because the circuit impedance reducing element has a current bypass effect. In addition, it was found that a reduction in the inductance of the gate line (particularly, the inductance L1 of the line in the module) was effective in obtaining the current bypass effect.

For this reason, as illustrated in FIG. 1, when the first conductive post 8, the conductive post 11g, and the first metal layers 5g1 and 5g2 are used as the gate line, it is possible to suppress the inductance Li of the line to, for example, 5 nH to 10 nH and to reduce the inductance Li of the line to one-fourth to one-eighth of the inductance when the bonding wire is used.

Therefore, in this embodiment, it is possible to improve the current bypass effect of the circuit impedance reducing element (capacitor 10). As a result, it is possible to prevent the MOSFET Q2 from being unintentionally turned on and to expand the range of the value of di/dt or dV/dt in which the MOSFET Q2 can be used.

When the MOSFET Q2 of the lower arm is turned on with the MOSFET Q1 of the upper arm turned off, in some cases, the MOSFET Q1 of the upper arm is unintentionally turned on, similarly to the above. Therefore, as illustrated in FIG. 3, it is effective to connect the circuit impedance reducing element (here, the capacitor 10) between the gate electrode G1 and the source electrode S1 of the MOSFET Q1.

In the first and second embodiments, the capacitor 10 is connected between the first metal layer 5g2 and the second metal layer 5s2 on the front surface of the printed circuit board 5. However, the invention is not limited this.

Next, a power semiconductor module according to a third embodiment will be described with reference to FIGS. 4 to 10. In FIGS. 4 to 10, components corresponding to those illustrated in FIG. 1 are denoted by the same reference numerals.

The third embodiment is a more detailed structure of the second embodiment.

That is, in the third embodiment, reference PM indicates a power semiconductor module as a semiconductor device including two power semiconductor modules 2. The power semiconductor module PM includes an insulating substrate 3A and a lower arm portion 13A including a first semiconductor chip 4A and a second semiconductor chip 4B which are fixed to the insulating substrate 3A. In addition, the power semiconductor module PM includes an insulating substrate 3B and an upper arm portion 13B including a first semiconductor chip 4A and a second semiconductor chip 4B which are fixed to the insulating substrate 3B. Furthermore, the power semiconductor module PM includes a printed circuit board 5 which faces the insulating substrates 3A and 3B and includes a wiring metal layer.

The first semiconductor chip 4A is a power semiconductor element for switching, such as a power MOSFET, which is the same as that in the first and second embodiments. The second semiconductor chip 4B is a free wheeling diode (FWD) that is connected in inverse parallel to the first semiconductor chip 4A.

Figure 6A:
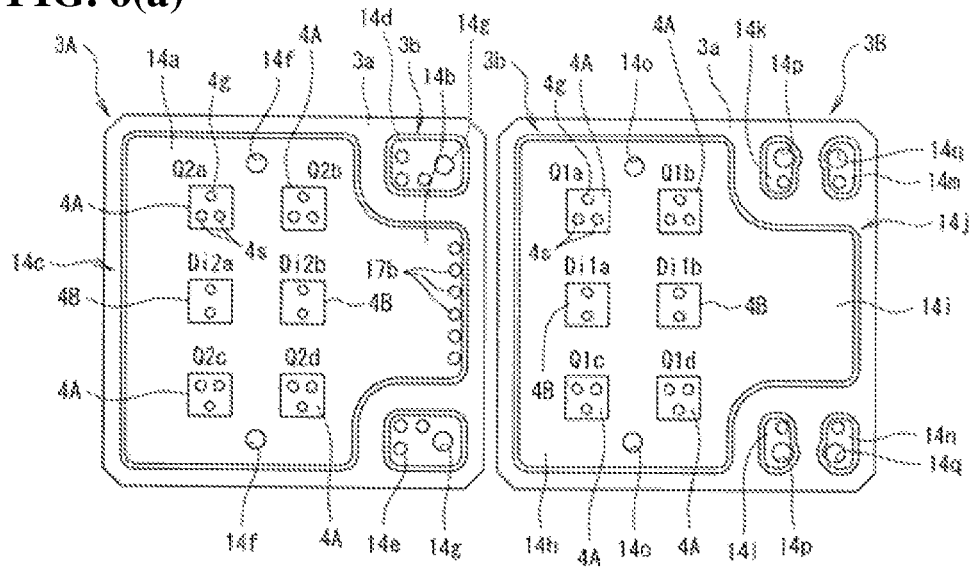
FIG. 6(a) is a plan view illustrating an insulating substrate illustrated in FIG. 5.
Figure 6B:
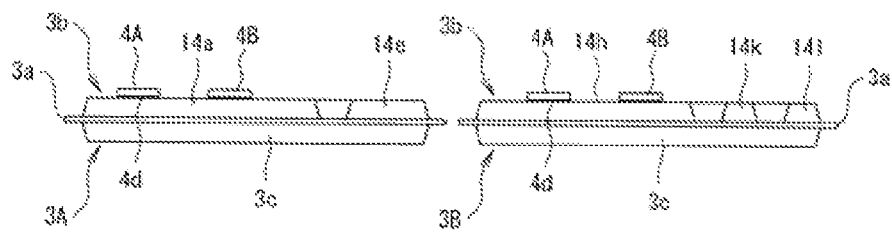
FIG. 6(b) is a side view illustrating the insulating substrate.
Figure 6C:
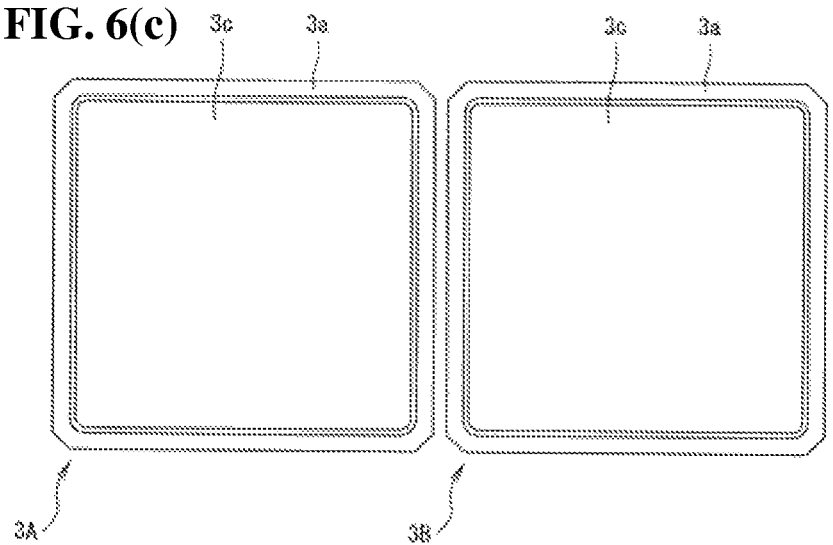
FIG. 6(c) is a bottom view illustrating the insulating substrate.

As illustrated in FIG. 6(a), two second semiconductor chips 4B are arranged on a center line of each of the insulating substrates 3A and 3B in the longitudinal direction at a predetermined interval. In addition, four first semiconductor chips 4A are arranged outside the second semiconductor chips 4B at predetermined intervals.

The first semiconductor chip 4A has a drain electrode 4d on the rear surface and has a source electrode 4s and a gate electrode 4g on the front surface. The gate electrode 4g is arranged at the end that is opposite to the second semiconductor chip 4B. The second semiconductor chip 4B has a cathode electrode on the rear surface and has an anode electrode on the front surface.

The semiconductor chips 4A and 4B are various types of power semiconductor elements as described above. However, the semiconductor chips 4A and 4B may be formed on a silicon substrate, a SiC substrate, or other substrates.

The insulating substrate 3A includes a square-shaped insulating plate 3a, a circuit plate 3b that is fixed to a main surface of the insulating plate 3a, and a metal plate 3c that is fixed to a surface of the insulating plate 3a opposite to the main surface.

As illustrated in FIG. 6(a), the circuit plate 3b of the insulating substrate 3A includes a third circuit plate 14c for a drain electrode which includes a wide portion 14a and a narrow portion 14b and has a T-shape in a plan view.

In addition, the circuit plate 3b of the insulating substrate 3A includes second circuit plates 14d and 14e for a source electrode which are arranged outside the narrow portion 14b at a predetermined interval.

The first semiconductor chip 4A and the second semiconductor chip 4B are electrically and mechanically connected to the third circuit plate 14c. A hole 14f into which an external terminal 19 that will be an S1/D2 terminal is inserted is provided in the third circuit plate 14c. In addition, a hole 14g into which an external terminal 20 that will be an S2 terminal is inserted is provided in each of the second circuit plates 14d and 14e.

Similarly to the insulating substrate 3A, the insulating substrate 3B includes an insulating plate 3a, a circuit plate 3b, and a metal plate 3c. The circuit plate 3b of the insulating substrate 3B includes a third circuit plate 14j for a drain electrode which includes a wide portion 14h and a narrow portion 14i. In addition, the circuit plate 3b of the insulating substrate 3B includes circuit plates 14k, 14l, 14m, and 14n which are arranged outside the narrow portion 14i of the third circuit plate 14j at predetermined intervals. Among them, the circuit plates 14k and 14l are fourth circuit plates for an auxiliary source electrode and the circuit plates 14m and 14n are first circuit plates for a gate electrode.

The first semiconductor chip 4A and the second semiconductor chip 4B are electrically and mechanically connected to the third circuit plate 14j. A hole 14o into which an external terminal 18 that will be a D1 terminal is inserted is provided in the third circuit plate 14j. In addition, holes 14p into which external terminals 21a and 21b that will be SS1 and SS2 terminals are inserted are provided in the fourth circuit plates 14k and 14l. Furthermore, holes 14q into which external terminals 22a and 22b that will be G1 and G2 terminals are inserted are provided in the first circuit plates 14m and 14n.

The external terminals 18, 19, 20, 21*a*, 21*b*, 22*a*, and 22*b* are preferably made of a copper-based or aluminum-based material with high conductivity. When each external terminal is bonded to the circuit plate 3*b* by solder, it is effective to perform a surface treatment on the external terminals 18, 19, 20, 21*a*, 21*b*, 22*a*, and 22*b* with a nickel-based or tin-based material.

Figure 8:
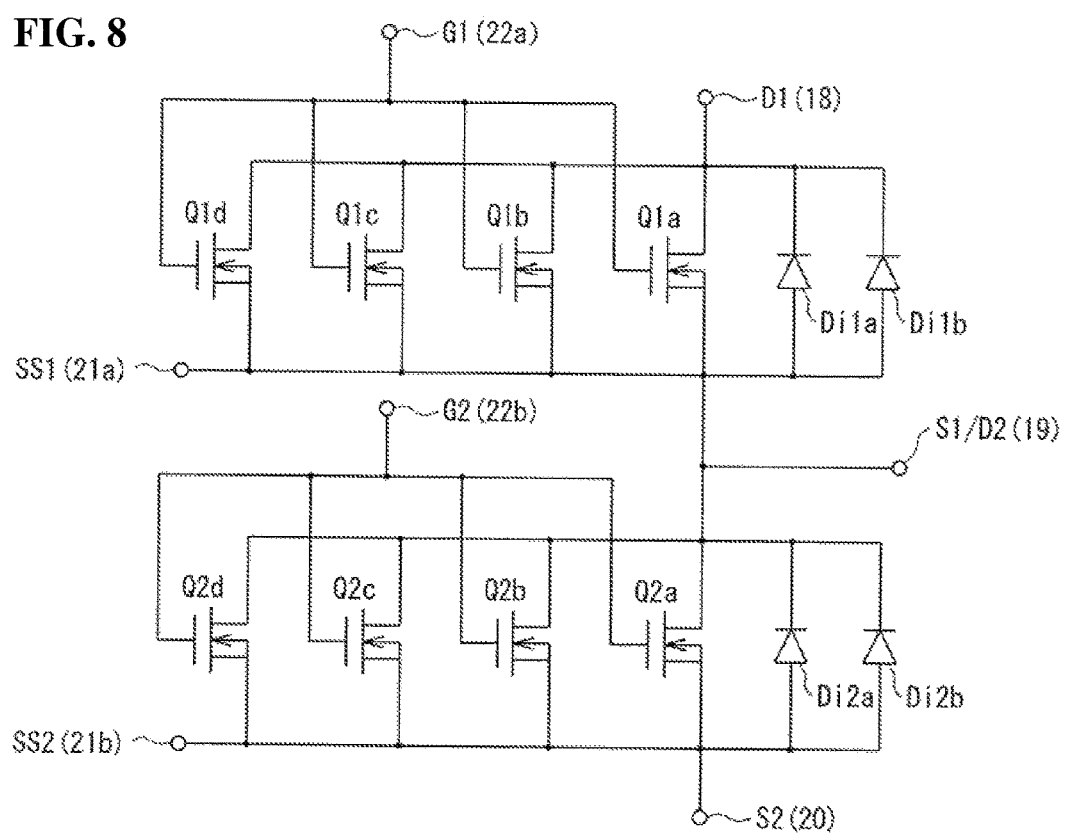
FIG. 8 is a circuit diagram illustrating an equivalent circuit of the semiconductor device illustrated in FIG. 5.

As shown in the equivalent circuit diagram illustrated in FIG. 8, the first semiconductor chip 4A (MOSFETs Q1*a* to Q1*d*) and the second semiconductor chip 4B (diodes Di1*a* and Di1*b*) forming the upper arm portion are connected in inverse parallel to each other on the insulating substrate 3B. In addition, the first semiconductor chip 4A (MOSFETs Q2*a* to Q2*d*) and the second semiconductor chip 4B (diodes Di2*a* and Di2*b*) forming the lower arm portion are connected in inverse parallel to each other on the insulating substrate 3A.

Two antiparallel circuits formed on the insulating substrate 3B and the insulating substrate 3A are connected in series to each other through the printed circuit board 5 and the conductive posts 17*b*.

The drain electrode 4*d* of each of the MOSFETs Q1*a* to Q1*d* are connected to the external terminal 18 forming the drain terminal D1 of the power semiconductor module PM through the third circuit plate 14*j*. The drain electrode 4*d* each of the MOSFETs Q2*a* to Q2*d* is connected to the external terminal 19 forming the S1/D2 terminal of the power semiconductor module PM through the third circuit plate 14*c*.

Figure 4:
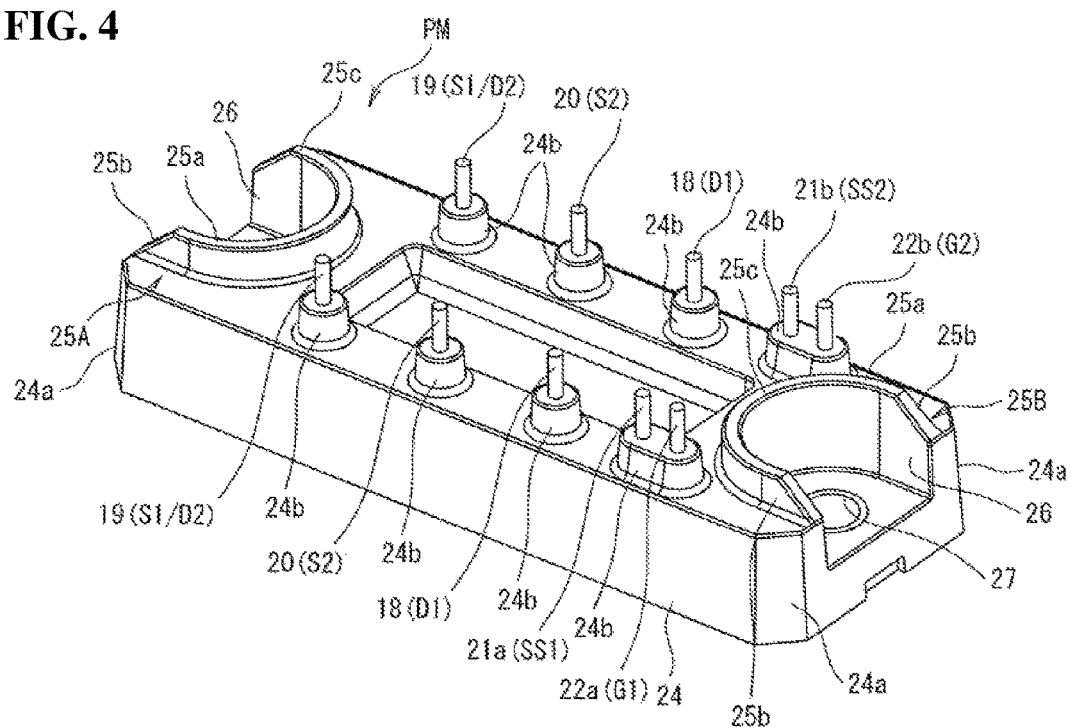
FIG. 4 is a perspective view illustrating a third embodiment of the semiconductor device according to the invention.
Figure 5:
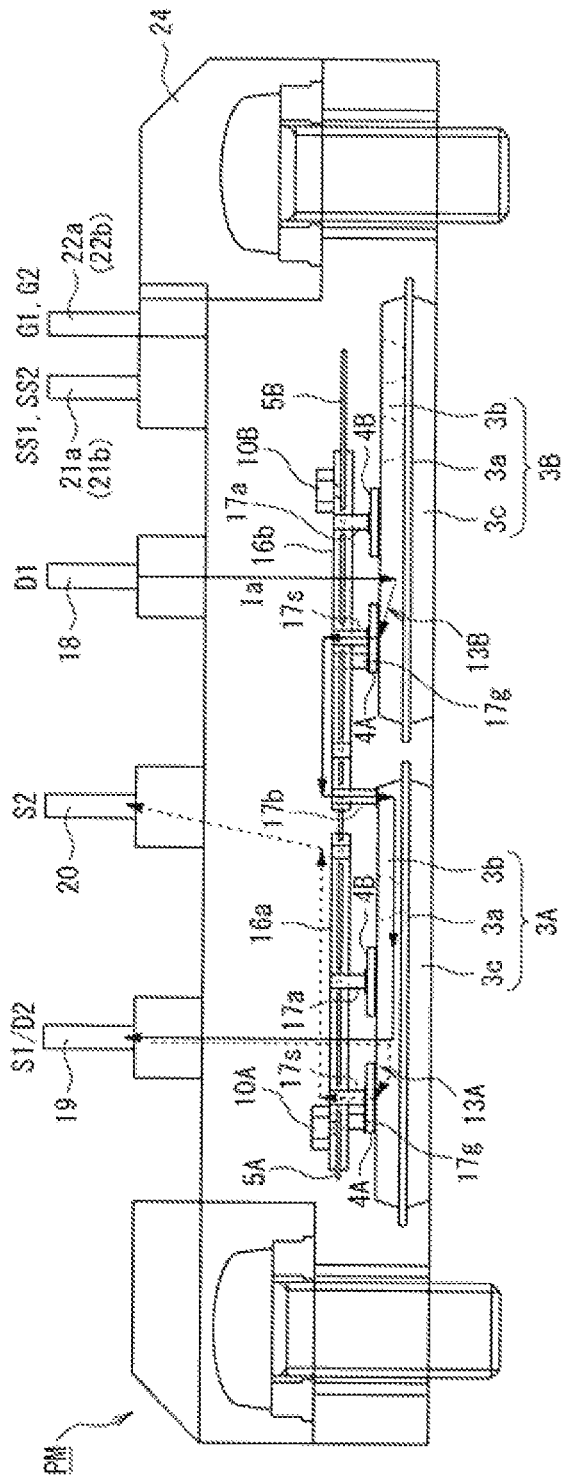
FIG. 5 is a vertical cross-sectional view illustrating the semiconductor device illustrated in FIG. 4.

As illustrated in FIG. 4, the external terminals 18 to 20 are formed such that each pair of two external terminals are symmetric with respect to the center line of the power semiconductor module PM in the width direction. The power semiconductor module PM further includes a total of four external terminals 21*a*, 21*b*, 22*a*, and 22*b* which are provided outside the external terminal 18 in the longitudinal direction. The external terminals 18, 19, 20, 21*a*, 21*b*, 22*a*, and 22*b* are arranged in two rows in a substantially straight line along two sides of the power semiconductor module PM.

The external terminals 21*a*, 21*b* are auxiliary source terminals and form current detection terminals SS1 and SS2 which sense a current flowing between the drain and the source of each of the MOSFETs Q1*a* to Q1*d* and the MOSFETs Q2*a* to Q2*d*. The external terminals 22*a* and 22*b* form gate terminals G1 and G2 for supplying a gate control signal to the gate electrode 4*g* of each of the MOSFETs Q1*a* to Q1*d* and the MOSFETs Q2*a* to Q2*d* in a half bridge circuit.

The metal plate 3*c* which is provided on the rear surface side of each of the insulating substrates 3A and 3B has a lower surface that is flush with the bottom of an insulating resin 24 or slightly protrudes from the bottom of the insulating resin 24.

FIG. 7(*a*) illustrates the front surface of the printed circuit board and FIG. 7(*b*) illustrates the rear surface of the printed circuit board. T-shaped second metal layers 16*a* and 16*b* which will be the current paths of the lower arm portion 13A and the upper arm portion 13B are formed on the printed circuit board 5. The second metal layers 16*a* and 16*b* and the source electrodes 4*s* of the first semiconductor chips 4A in the lower arm portion 13A and the upper arm portion 13B are electrically and mechanically connected to both ends of the second conductive posts 17*s*. In addition, the second metal layers 16*a* on the front surface and the rear surface of the printed circuit board 5 have the same potential. Similarly, the second metal layers 16*b* on the front surface and the rear surface have the same potential.

First metal layers 16*c* and 16*d* which are control circuits for the lower arm portion 13A and the upper arm portion 13B are formed on the front surface of the printed circuit board 5. The first metal layers 16*c* and 16*d* and the gate electrodes 4*g* of the first semiconductor chips 4A in the lower arm portion 13A and the upper arm portion 13B are electrically and mechanically connected to both ends of first conductive posts 17*g*.

The first metal layer 16*c* includes first metal layers 16*e*1, 16*e*2, 16*e*3, and 16*h*. The first metal layer 16*d* includes first metal layers 16*j*1, 16*j*2, 16*j*3, and 16*m*. As illustrated in FIGS. 7(*a*), 7(*b*), the first metal layer 16*c* is arranged such that the lengths of wires to the gate electrodes 4*g* of the MOSFETs Q1*a* to Q1*d* are equal to each other by the first metal layers 16*e*1 and 16*e*2. Similarly, the first metal layer 16*d* is arranged such that the lengths of wires to the gate electrodes 4*g* of the MOSFETs Q2*a* to Q2*d* are equal to each other by the first metal layers 16*j*1 and 16*j*2.

The printed circuit board 5 has through holes 16*o*, 16*p*, and 16*q* through which the external terminals 18, 19, and 20 pass without contacting the printed circuit board 5.

In addition, second metal layers 16*r* and 16*s* which function as the current paths of the lower arm portion 13A and the upper arm portion 13B are provided on the rear surface of the printed circuit board 5. The second metal layers 16*r* and 16*s* are arranged so as to overlap the first metal layers 16*h* and 16*m* provided on the front surface in a plan view. The second metal layers 16*r* and 16*s* are electrically connected to second metal layers 16*v* and 16*w*.

As such, since the first metal layers 16*h* and 16*m*, which are gate lines, and the second metal layers 16*r* and 16*s*, which are source lines, are arranged at the positions that are facing each other, it is possible reduce the mutual inductance between the two types of metal layers. Since the mutual inductance is reduced, it is possible to stabilize the control of the MOSFETs Q1*a* to Q1*d* and the MOSFETs Q2*a* to Q2*d*.

The second metal layer 16*b* of the printed circuit board 5 is electrically connected to the third circuit plate 14*c* of the insulating substrate 3A by a plurality of conductive posts 17*b* and forms a current path between the lower arm portion 13A and the upper arm portion 13B.

In addition, on the front surface of the printed circuit board 5, a capacitor 10A, which functions as a circuit impedance reducing element, is electrically and mechanically connected between a connection region between the first metal layers 16*e* and 16*h* which are electrically connected to the gate electrode of the first semiconductor chip 4A in the lower arm portion 13A and the second metal layer 16*a* which is adjacent to the connection region.

Similarly, on the front surface of the printed circuit board 5, a capacitor 10B, which functions as a circuit impedance reducing element, is electrically and mechanically connected between a connection region between the first metal layers 16*j* and 16*m* which are electrically connected to the gate electrode of the first semiconductor chip 4A in the upper arm portion 13B and the second metal layer 16*b* which is adjacent to the connection region.

Next, a process for manufacturing the power semiconductor module PM will be described.

The ends of the conductive posts 17*a*, 17*b*, 17*g*, and 17*s* are electrically and mechanically connected to predetermined positions of the printed circuit board 5 which is prepared in advance.

Figure 9:
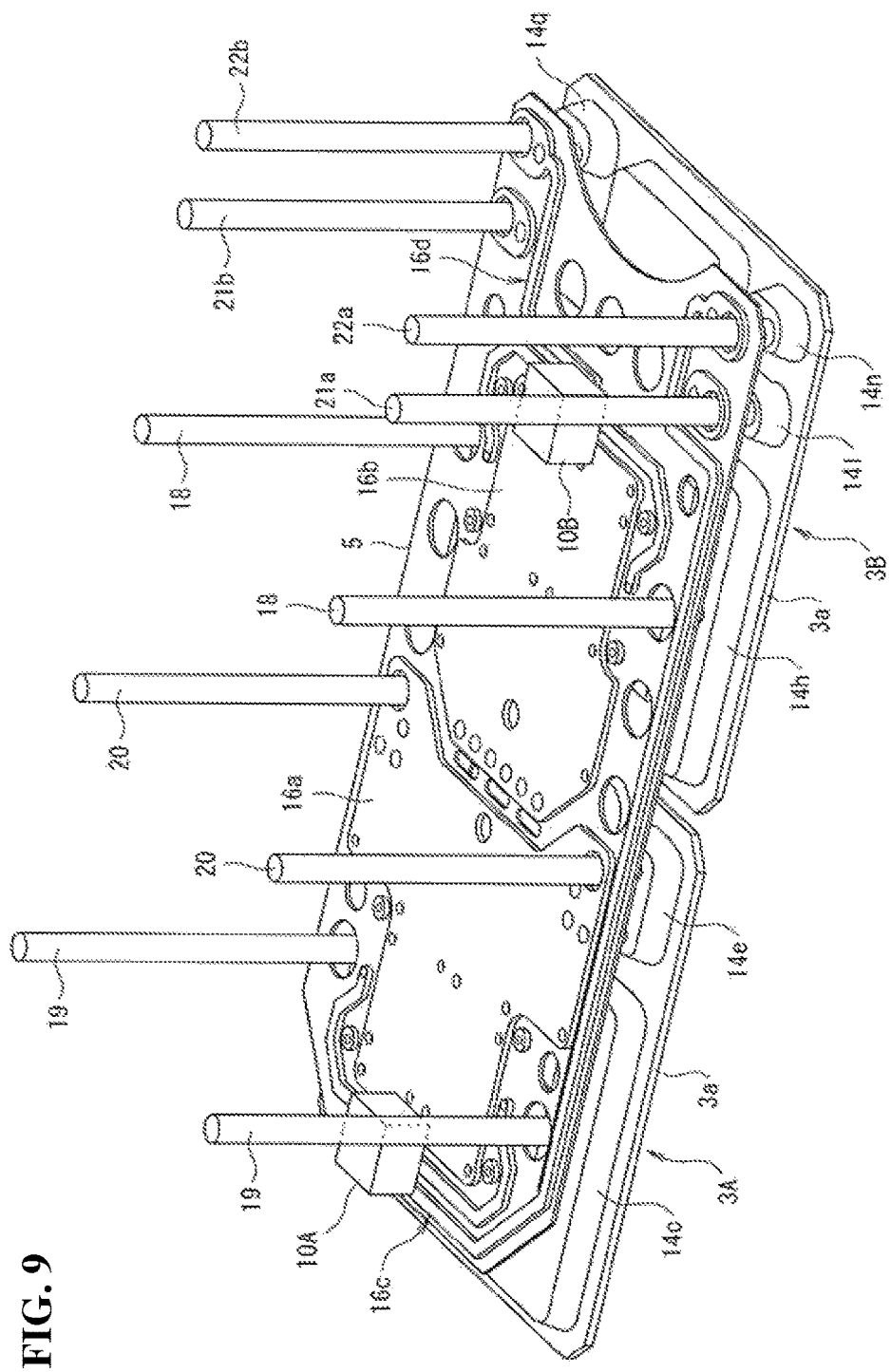
FIG. 9 is a perspective view illustrating a state in which the printed circuit board is mounted on the insulating substrate.

Then, as illustrated in FIG. 9, the external terminals 18, 19, 20, 21a, 21b, 22a, and 22b are inserted into the insulating substrate 3A and 3B and are vertically held. In this state, the printed circuit board 5 is arranged above the insulating substrates 3A and 3B.

At that time, the other ends of the conductive posts 17a, 17b, 17g, and 17s contact the first semiconductor chip 4A, the second semiconductor chip 4B, and the third circuit plates 14c and 14j through, for example, solder or metal particle paste. In addition, the capacitor 10A is provided between the connection region between the first metal layers 16e and 16h and the second metal layer 16a which is adjacent to the connection region through solder. The capacitor 10B is provided between the connection region between the first metal layers 16j and 16m and the second metal layer 16b which is adjacent to the connection region through solder.

In this state, a reflow process is performed to electrically and mechanically connect the ends of the conductive posts 17a, 17b, 17g, and 17s to the first semiconductor chips 4A, the second semiconductor chips 4B, and the third circuit plates 14c and 14j. In addition, the capacitors 10A and 10B are electrically connected between the first metal layers 16c and 16d and the second metal layers 16a and 16b.

During the above-mentioned process, the second circuit plates 14d and 14e of the insulating substrate 3A and the second metal layer 16a of the printed circuit board 5 are electrically connected to each other by conductive posts (not illustrated). The fourth circuit plates 14k and 14l of the insulating substrate 3B are electrically connected to the second metal layers 16w and 16v of the printed circuit board 5 by conductive posts (not illustrated), respectively. The first circuit plates 14m and 14n of the insulating substrate 3B are electrically connected to the first metal layers 16l and 16g of the printed circuit board 5 by conductive posts (not illustrated), respectively.

As such, after the insulating substrates 3A and 3B and the printed circuit board 5 are electrically and mechanically connected to each other, they are placed into a mold (not illustrated) and an epoxy resin material, such as a thermosetting resin, is injected into the mold. Then, the insulating resin 24 having a rectangular parallelepiped shape illustrated in FIG. 4 is formed as the outward shape of the power semiconductor module PM. The power semiconductor module PM is manufactured by these processes.

As illustrated in FIG. 4, insulating walls 25A and 25B are formed at both ends of the insulating resin 24 in the longitudinal direction. In addition, attachment holes 27 are provided at the bottoms of concave portions 26 forming the insulating walls 25A and 25B so as to pass through the bottom of the insulating resin 24.

The external terminals 21a, 21b, 22a, and 22b of the power semiconductor module PM having the above-mentioned structure are connected to a driving circuit to form one phase of an inverter circuit. In addition, three power semiconductor modules can be combined with each other to form a three-phase (U, V, and W) inverter circuit.

When the inverter apparatus is formed in this way, the switching of the MOSFETs Q1a to Q1d of the lower arm portion 13A and the MOSFETs Q2a to Q2d of the upper arm portion 13B in the power semiconductor module PM is alternately controlled such that, when one of the two sets of MOSFETS is turned on, the other set of MOSFETs is turned off. In the power semiconductor module PM, as represented by a solid arrow in FIG. 5, a current Ia which is output from the external terminal 18 is supplied to the drain electrodes of the MOSFETs Q1a to Q1d through the circuit plate 3b of the upper arm portion 13B. When the MOSFETs Q1a to Q1d are in an on state, the current Ia is supplied to the circuit plate 3b of the insulating substrate 3A through the second conductive post 17s, the second metal layer 16b of the printed circuit board 5, and the conductive post 17b.

The current Ia supplied to the circuit plate 3b of the insulating substrate 3A is output as, for example, a U-phase output to a load through the external terminal 19.

In this case, since the MOSFETs Q2a to Q2d of the lower arm portion 13A are in an off state, the current is not output to the source electrode and the external terminal 20 is in a current blocking state.

Then, when the MOSFETs Q1a to Q1d of the upper arm portion 13B are turned off, the current Ia is gradually reduced. At the same time, the MOSFETs Q2a to Q2d of the lower arm portion 13A are turned on. In this state, as represented by a dashed arrow in FIG. 5, a current is input from the load to the drain electrodes of the MOSFETs Q2a to Q2d through the external terminal 19 and the circuit plate 3b of the insulating substrate 3A. In this case, since the MOSFETs Q2a to Q2d are in an on state, the current input to the drain electrode is output from the source electrode to the external terminal 20 through the second conductive post 17s and the second metal layer 16a of the printed circuit board 5. The current returns from the external terminal 20 to, for example, the negative electrode of the power supply.

Therefore, in the circuit plate 3b of the insulating substrate 3A, the current represented by a solid arrow is reduced and a current change rate di/dt is negative. Then, the current represented by a dashed line which flows to the printed circuit board 5 increases and the current change rate di/dt is positive. Therefore, the self-inductance L1 of the circuit plate 3b is connected in series to the self-inductance L2 of the second metal layer 16a of the printed circuit board 5. When the mutual inductance therebetween is M, the voltage v between the terminals can be represented by the following expression:

$$v=\{L1(di/dt)+M(di/dt)\}+\{L2(di/dt)+M(di/dt)\}.$$

Therefore, the current change rate di/dt of the circuit plate 3b of the insulating substrate 3A is negative and the current change rate di/dt of the second metal layer 16a of the printed circuit board 5 is positive. It is possible to cancel the mutual inductance M.

As described above, the current path between the lower arm portion 13A and the upper arm portion 13B is formed by the second conductive post 17s, the second metal layer 16b of the printed circuit board 5, and a plurality of conductive posts 17b. Therefore, it is possible to reduce a wiring distance and to increase the cross-sectional area of the current path. As a result, it is possible to reduce the inductance Li of the internal wire to, for example, 5 nH to 10 nH.

In addition, since the capacitor 10A as the circuit impedance reducing element is electrically connected between the first metal layer 16c and the second metal layer 16a of the printed circuit board 5, it is possible to suppress a change in the gate voltage of the MOSFET Q2 using the current bypass effect. In addition, since the capacitor 10B as the circuit impedance reducing element is electrically connected between the first metal layer 16d and the second metal layer 16b of the printed circuit board 5, it is possible to suppress a change in the gate voltage of the MOSFET Q1 using the current bypass effect. Therefore, it is possible to expand the range of the value di/dt or dV/dt in which the MOSFETs Q1 and Q2 can be used.

Figure 10:
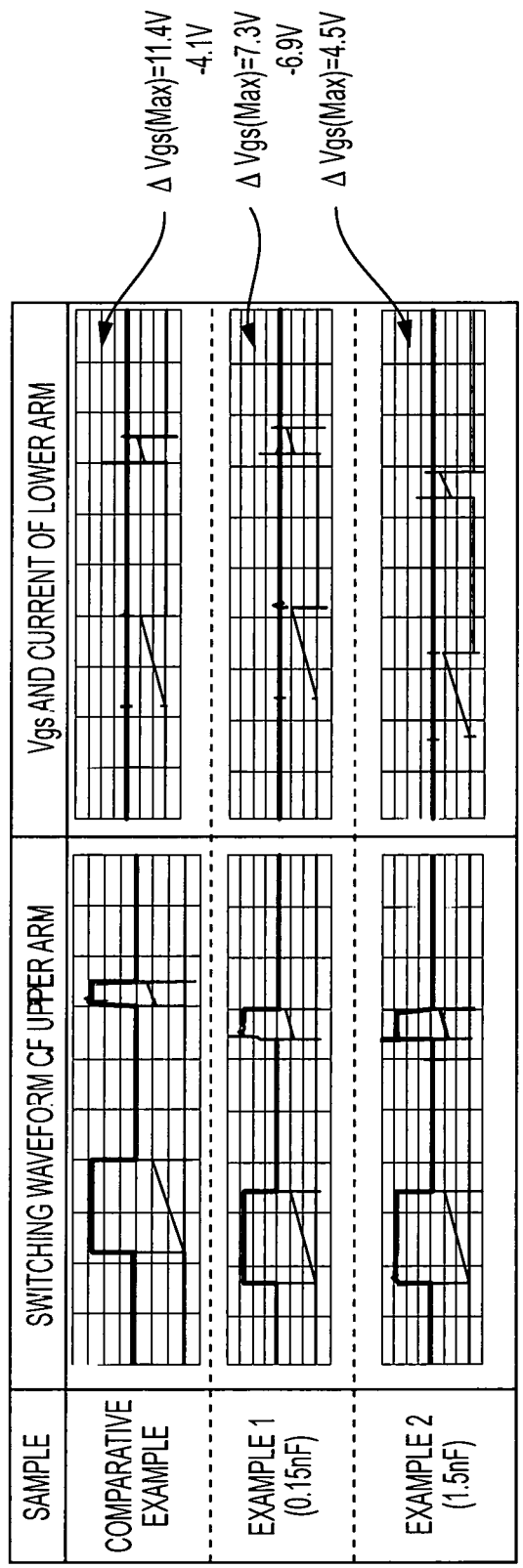
FIG. 10 is a diagram illustrating voltage and current waveforms during an operation in the third embodiment.

FIG. 10 illustrates the comparison result between Examples 1 and 2 in which the capacitors 10A and 10B are connected using the power semiconductor module PM and a comparative example in which the capacitors 10A and 10B are not connected.

In Example 1, the capacitance of each of the capacitors 10A and 10B is 0.15 nF. In Example 2, the capacitance of each of the capacitors 10A and 10B is 1.5 nF. In FIG. 10, the left side illustrates the voltage waveform and the current waveform of the upper arm (MOSFET Q1) during switching and the right side illustrates the gate-source voltage Vgs and the gate current waveform of the lower arm (MOSFET Q2). Here, the MOSFETs Q2a to Q2d are not turned on and are maintained in an off state at a gate-source voltage Vgs of −9 V.

The result proved that, during the switching of the MOSFET Q1, the maximum change rate ΔVgs (max) of the gate-source voltage Vgs of the MOSFET Q2 was up to 11.4 V in the comparative example. That is, since a positive voltage that is higher than a threshold voltage with (=−9 V) is applied to the MOSFET Q2, the MOSFET Q2 is unintentionally turned on.

In contrast, in Example 1, the maximum change rate ΔVgs (max) can be suppressed to 7.3 V and it is possible to prevent the MOSFET Q2 from being unintentionally turned on. In Example 2, the maximum change rate ΔVgs (max) can be suppressed to 4.5 V and it is possible to reliably prevent the MOSFET Q2 from being unintentionally turned on.

In the above-described embodiments, the capacitor is used as the circuit impedance reducing element. However, the circuit impedance reducing element is not limited to the capacitor. A diode or a MOSFET can be used as the circuit impedance reducing element. That is, any element may be used as long as it has a current bypass effect which electrically connects the gate line and the source line of the MOSFET, if necessary, to suppress a change in gate voltage.

In the above-described embodiments, since the insulating substrates 3A and 3B are separately provided, it is possible to suppress the internal stress of the insulating substrate caused by heat generated from the first semiconductor chip 4A. Therefore, it is possible to further improve the reliability of the power semiconductor module PM.

In addition, since the gate electrode of the first semiconductor chip 4A is arranged on the side opposite to the second semiconductor chip 4B, it is possible to arrange the path of the first metal layer (16c and 16d) without traversing the second metal layer (16a and 16b). Therefore, it is possible to easily lay out the lines of the printed circuit board 5.

In the above-described embodiments, the insulating substrates 3A and 3B are provided in the lower arm portion 13A and the upper arm portion 13B, respectively. However, the invention is not limited this. For example, when the difference between the linear expansion coefficients of an insulating substrate and a sealing material does not matter, a circuit plate 3b for the lower arm portion 13A and a circuit plate 3b for the upper arm portion 13B may be fixed to one insulating plate 3a and a common metal plate 3c may be fixed to the insulating plate 3a.

In the above-described embodiments, the insulating substrates 3, 3A, and 3B are not limited to the above-mentioned structures. For example, the following substrates can be used: a so-called active metal brazing (AMB) substrate obtained by brazing ceramics and copper and patterning copper using etching; and a direct copper bonding (DCB) substrate obtained by directly bonding a ceramic substrate and copper. In addition, for example, alumina ($Al_2O_3$), aluminum nitride (AlN), or silicon nitride ($Si_3N_4$) may be applied as the insulating plate 3a. A resin substrate may be applied as the insulating plate 3a. That is, any substrate may be used as long as it can ensure insulation.

In the above-described embodiments, the conductive posts 17a, 17b, 17g, and 17s have a cylindrical shape. However, the invention is not limited this. For example, conductive posts having any shape, such as a quadratic prism shape, a triangular prism shape, a polygonal prism shape, or an elliptical cylinder shape can be applied. That is, any conductive post may be used as long as it contributes to reducing inductance.

Figure 11A:
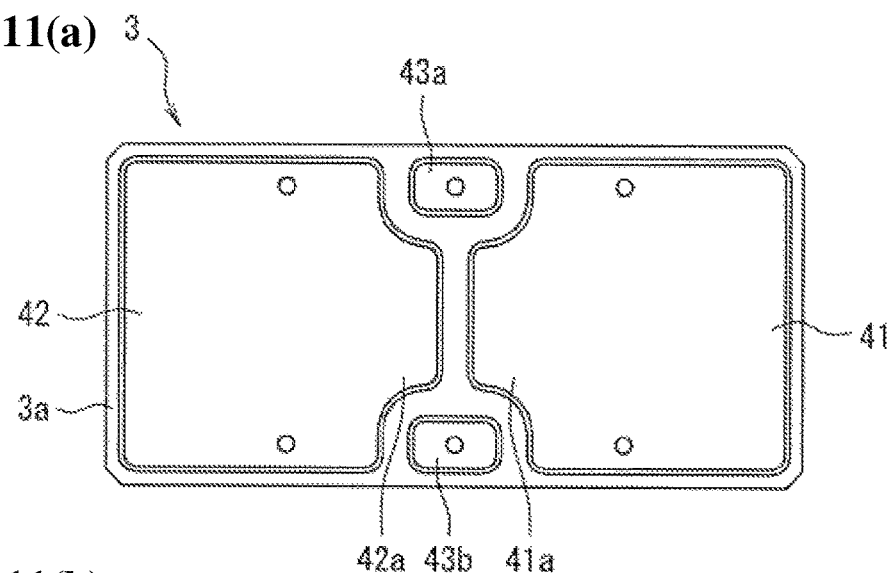
FIG. 11(a) is a plan view illustrating a modified example of the insulating substrate.
Figure 11B:
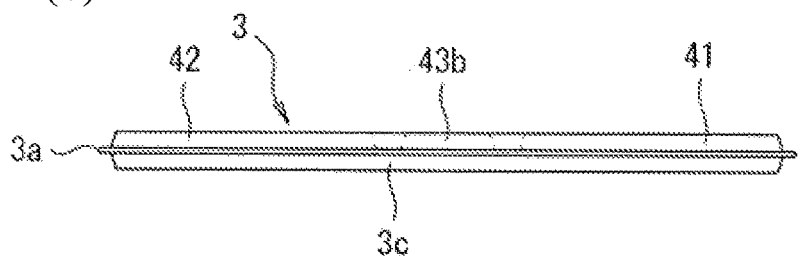
FIG. 11(b) is a side view illustrating the modified example of the insulating substrate.
Figure 11C:
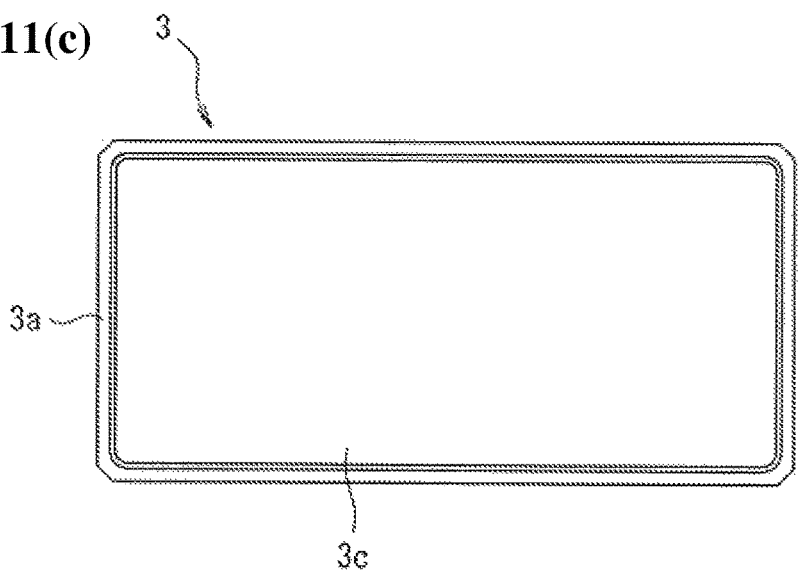
FIG. 11(c) is a bottom view illustrating the modified example of the insulating substrate.

In the above-described embodiments, all of the external terminals are attached to the insulating substrate. However, the invention is not limited this. The external terminal, such as the gate terminal or the source auxiliary terminal through which a large amount of current does not flow, may be directly attached to the printed circuit board. In this case, as illustrated in FIGS. 11(a) to 11(c), two circuit plates 41 and 42 may be provided on the insulating substrate 3 and circuit plates 43a and 43b may be independently provided outside the circuit plates 41 and 42. In this case, the area of the circuit plate increases and a cooling performance is improved, as compared to the above-described embodiments.

In the above-described embodiments, the power MOSFET is used as the first semiconductor chip 4A. However, the invention is not limited this. The first semiconductor chip 4A may be an IGBT. In this case, the source electrode and the drain electrode in the above-described embodiments may be replaced with an emitter electrode and a collector electrode, respectively. In addition, a voltage-controlled semiconductor element may be used.

In the above-described embodiments, both the first semiconductor chip 4A (MOSFET) and the second semiconductor chip 4B (diode) are arranged on each of the insulating substrates 3A and 3B. However, the invention is not limited this. For example, when a diode having a MOSFET provided therein can be used or when a synchronous rectification method is used, the second semiconductor chip 4B may be omitted and only the first semiconductor chip 4A may be provided. In addition, the first semiconductor chip 4A may be formed only by a reverse conducting IGBT (RC-IGBT) obtained by integrating an IGBT and an FWD into one chip.

In the above-described embodiments, the external terminal has a rod shape. However, a lead frame or a terminal with other shapes may be used as the external terminal. In the above-described embodiments, the external terminal protrudes from the upper surface of the power semiconductor module PM. However, the external terminal may protrude from the side surface of the power semiconductor module PM and may be bent upward.

Next, a fourth embodiment of the invention will be described with reference to FIGS. 12(a), 12(b) and 13.

Figure 7A:
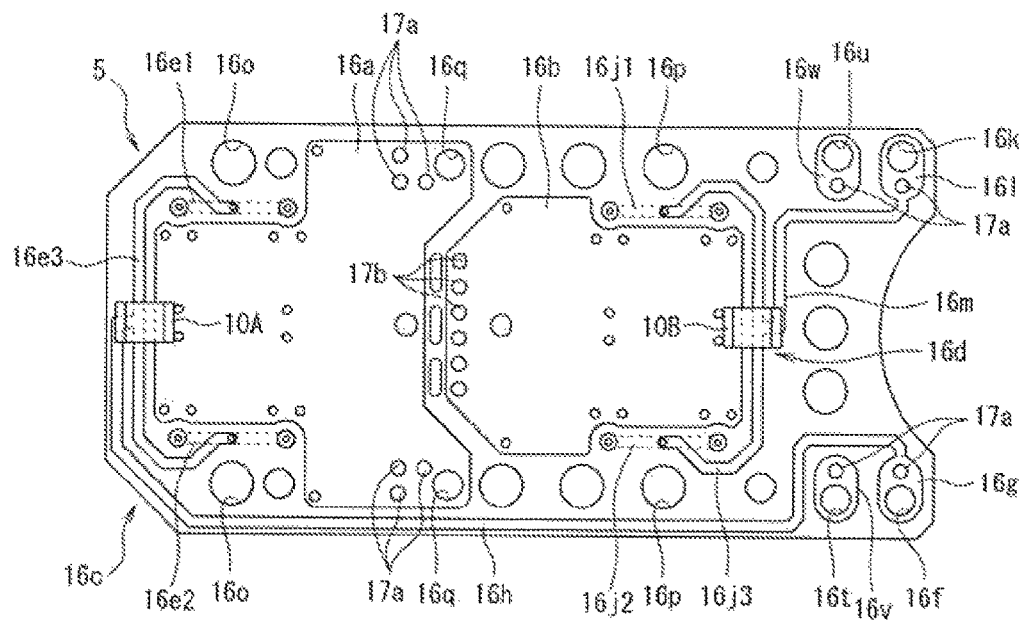
FIG. 7(a) is a front view illustrating a printed circuit board illustrated in FIG. 5
Figure 7B:
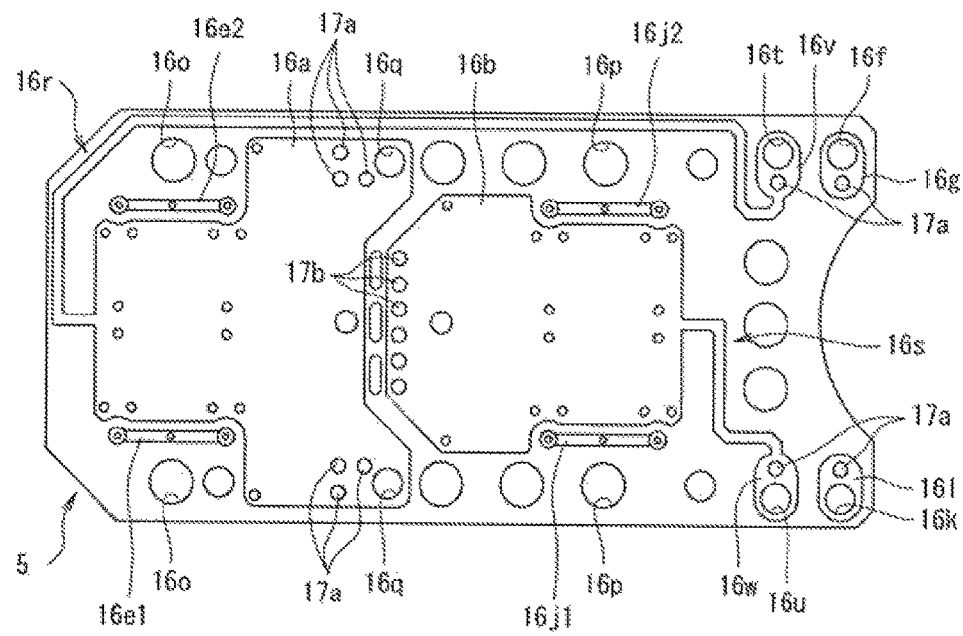
FIG. 7(b) is a rear view illustrating the printed circuit board.
Figure 12A:
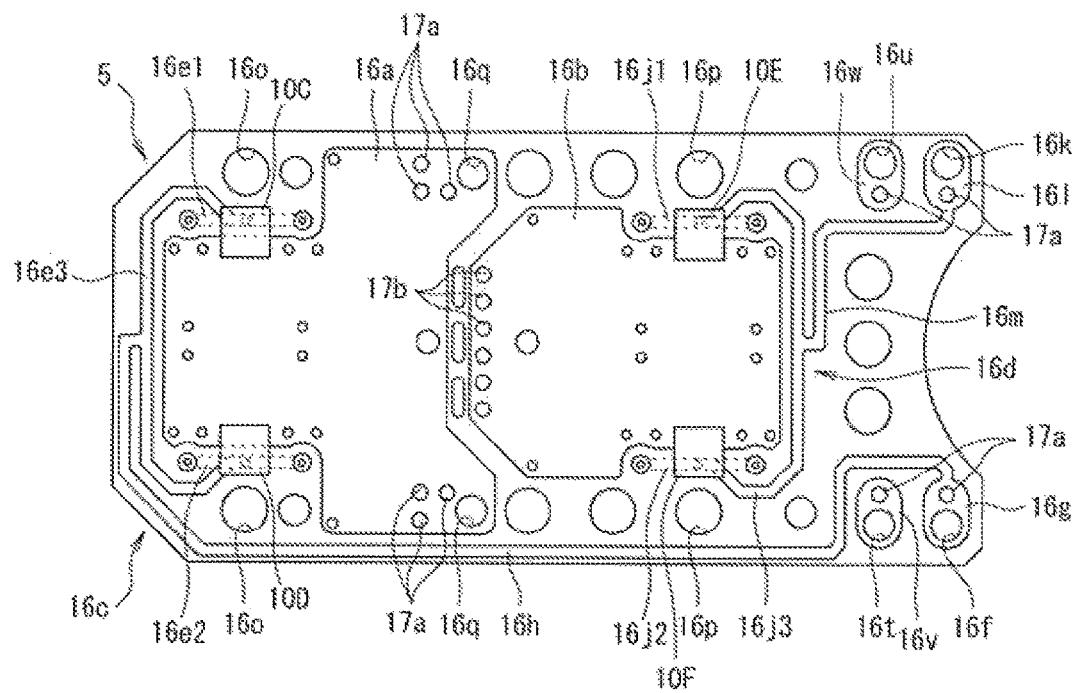
FIG. 12(a) is a front view illustrating a printed circuit board according to a fourth embodiment and FIG. 12(b) is a rear view illustrating the printed circuit board.
Figure 12B:
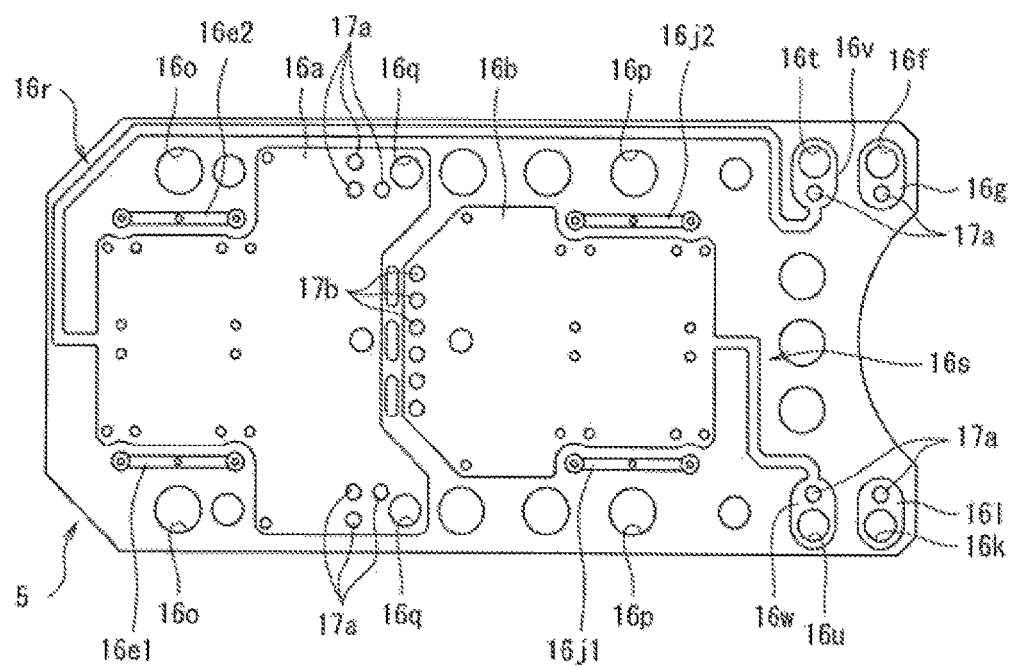

FIGS. 12(a), 12(b) are diagrams illustrating another example of the arrangement of capacitors as circuit impedance reducing elements which correspond to FIGS. 7(a), 7(b) in the third embodiment.

On the front surface of a printed circuit board 5, a capacitor 10C is electrically and mechanically connected between a connection region between first metal layers 16e1 and 16e3 which are electrically connected to a gate electrode of a first semiconductor chip 4A of a lower arm portion 13A and a second metal layer 16a which is adjacent to the connection region. A capacitor 10D is electrically and mechanically connected between a connection region between first metal layers 16e2 and 16e3 and the second metal layer 16a which is adjacent to the connection region.

Similarly, on the front surface of the printed circuit board 5, a capacitor 10E is electrically and mechanically connected between a connection region between first metal layers 16j1 and 16j3 which are electrically connected to a gate electrode of a first semiconductor chip 4A of an upper arm portion 13B and a second metal layer 16b which is adjacent to the connection region. A capacitor 10F is electrically and mechanically connected between a connection region between first metal layers 16j2 and 16j3 and the second metal layer 16b which is adjacent to the connection region.

As such, since the circuit impedance reducing element is provided at the position which is close to the gate electrode of the first semiconductor chip 4A and where the inductance of the line is small, it is possible to improve the current bypass effect of the circuit impedance reducing element. For example, when a capacitor is applied as the circuit impedance reducing element, an excellent current bypass effect is obtained by small capacitance. This is illustrated in FIG. 13.

Figure 13:
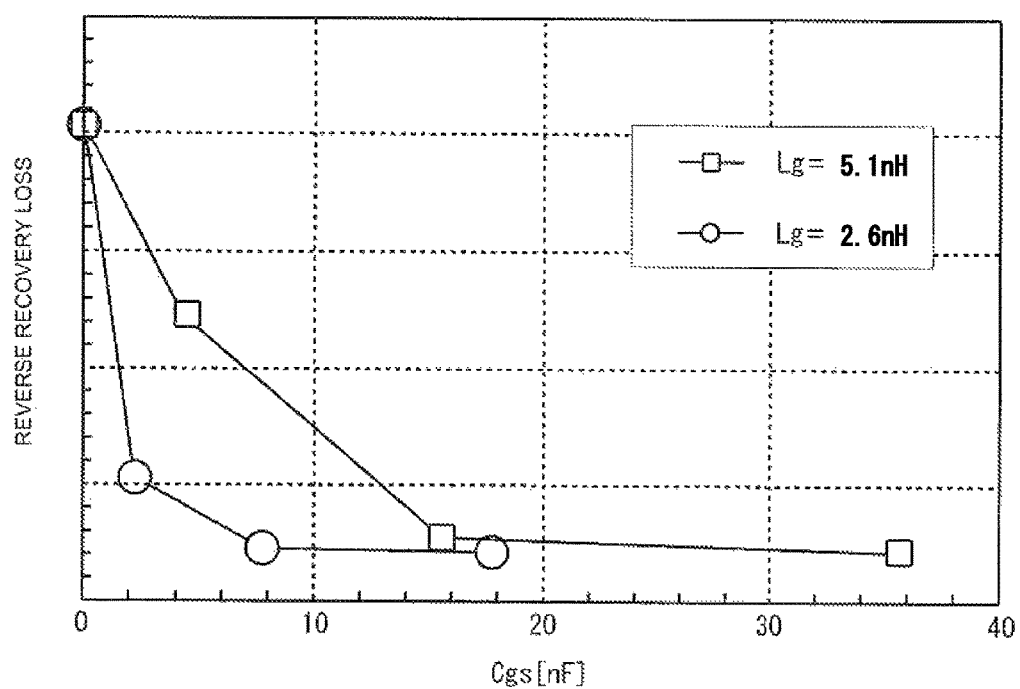
FIG. 13 is a diagram illustrating the relationship between the capacitance of a capacitor and reverse recovery loss in the fourth embodiment.

FIG. 13 is a diagram illustrating the relationship between the capacitance of the capacitor and the reverse recovery loss of the first semiconductor chip 4A when the capacitor is arranged at the positions where the inductance Lg of the line is 5.1 nH and 2.6 nH from the gate electrode of the first semiconductor chip 4A. When the first semiconductor chip 4A is unintentionally turned on, the reverse recovery loss increases. When the capacitor is arranged at the position where the inductance Lg of the line is smaller than shown in FIG. 13, the reverse recovery loss is reduced by the small capacitance of the capacitor. That is, when the capacitor is arranged at the position where the inductance Lg of the line is small, the first semiconductor chip 4A is prevented from being unintentionally turned on and an excellent current bypass effect is obtained.

Figure 17:
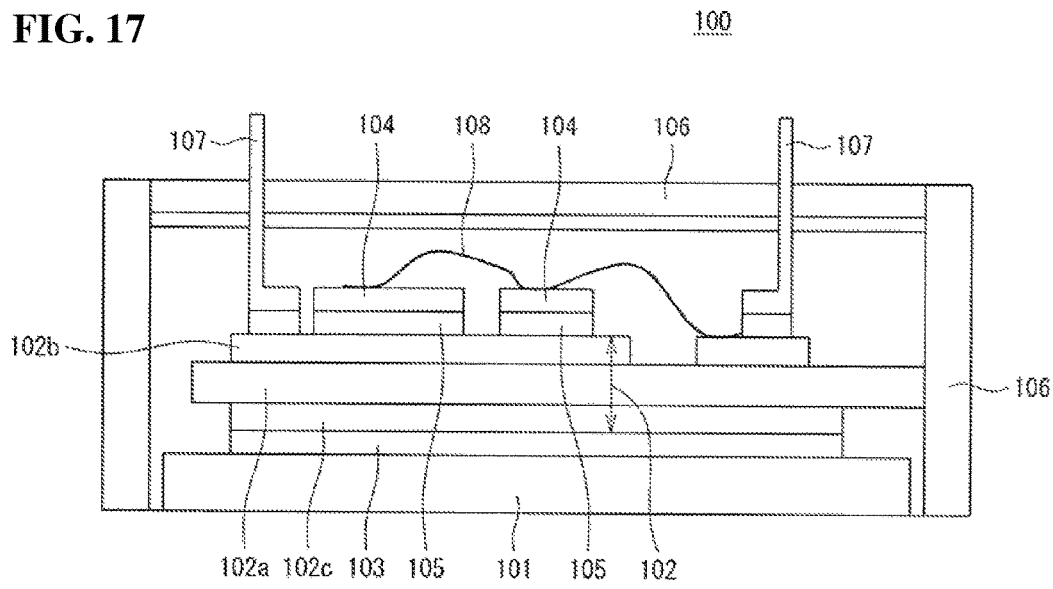
FIG. 17 is a cross-sectional view illustrating the related art.

In the semiconductor device 100 according to the related art illustrated in FIG. 17, the circuit impedance reducing element needs to be provided on a circuit board which is different from the circuit board having the semiconductor chip provided thereon on the insulating substrate. In addition, since the gate line is a bonding wire, it is difficult to provide the circuit impedance reducing element at the position where the inductance Lg of the line is small, unlike this embodiment.

In contrast, in this embodiment, since the conductive post and the printed circuit board are used as the gate line, the circuit impedance reducing element can be provided on the printed circuit board so as to be close to the gate electrode of the semiconductor chip. In addition, since the circuit impedance reducing element and the semiconductor chip are connected to each other by the conductive post, the inductance Lg of the line can be reduced to, for example, 5 nH or less. In other words, the circuit impedance reducing element (capacitors 10C to 10F) can be provided at the position where the inductance of the line is equal to or less than 5 nH from the gate electrode of the semiconductor chip. Therefore, it is possible to obtain the excellent current bypass effect illustrated in FIG. 13.

Next, a fifth embodiment of the invention will be described with reference to FIG. 14.

In the fifth embodiment, a capacitor is electrically and mechanically connected to conductive posts which protrude from an insulating resin of a power semiconductor module 2, instead of the structure according to the first embodiment in which the capacitor is connected to the printed circuit board 5.

Figure 14:
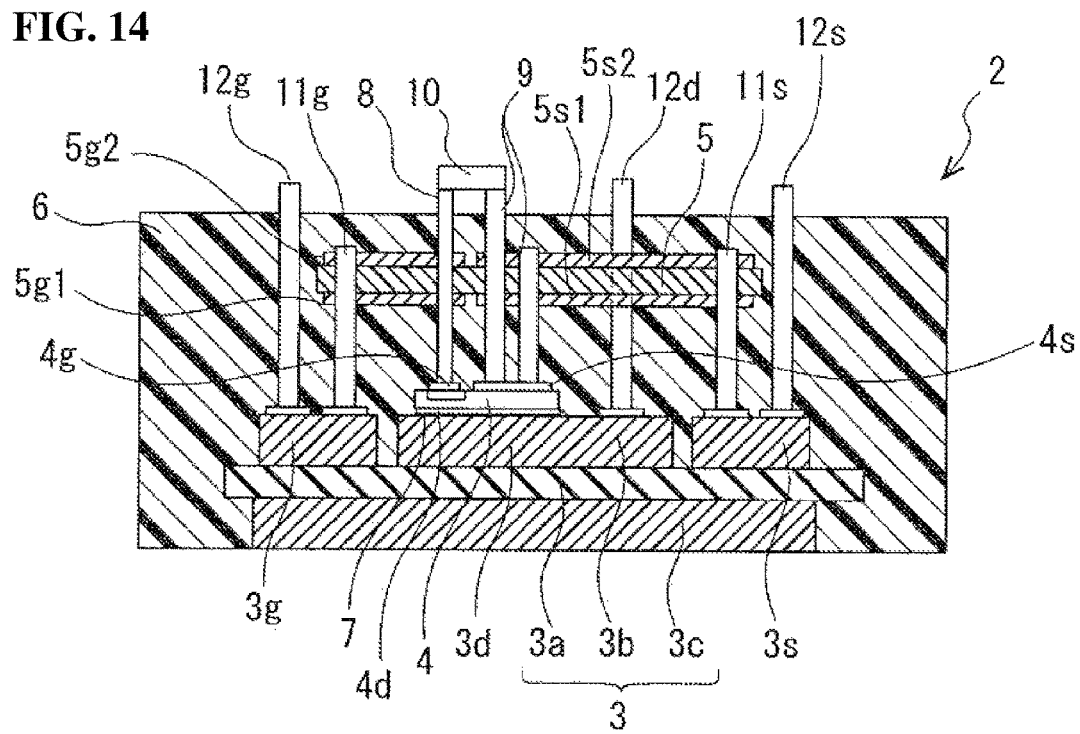
FIG. 14 is a cross-sectional view illustrating a main portion of a fifth embodiment of the semiconductor device according to the invention.

That is, in the fifth embodiment, as illustrated in FIG. 14, a first conductive post 8 passes through a printed circuit board 5 and extends so as to protrude from an insulating resin 6 in the structure illustrated in FIG. 1. In addition, a second conductive post 9 passes through the printed circuit board 5 and extends so as to protrude from the insulating resin 6. Then, a capacitor 10 is electrically and mechanically connected between the portions of the first conductive post 8 and the second conductive post 9 which protrude from the insulating resin 6.

In the fifth embodiment, the capacitor 10 is electrically connected between a gate electrode 4g and a source electrode 4s of a semiconductor chip 4 through the first conductive post 8 and the second conductive post 9. Therefore, an equivalent circuit is exactly the same as that in the first embodiment illustrated in FIG. 2. In addition, a wide metal layer and a thick conductive post are used as the gate line, similarly to the first embodiment.

Therefore, in the fifth embodiment, the power semiconductor module has an excellent current bypass effect and can suppress a variation in the gate voltage of the semiconductor chip 4.

Since the capacitor is connected between the first conductive post 8 and the second conductive post 9 protruding from the insulating resin 6, it is possible to connect a capacitor with arbitrary capacitance according to various specifications requested by the user. Therefore, it is possible to reduce the number of series of power semiconductor modules except for the capacitor in the expansion of the series of the power semiconductor modules 2. As a result, it is possible to reduce manufacturing costs.

In addition, even when the capacitor 10 is connected to the printed circuit board 5 as in the first embodiment, an addition capacitor may be connected between the first conductive post 8 and the second conductive post 9 protruding from the insulating resin 6 to adjust the total capacitance.

Next, a sixth embodiment of the invention will be described with reference to FIG. 15.

Figure 15:
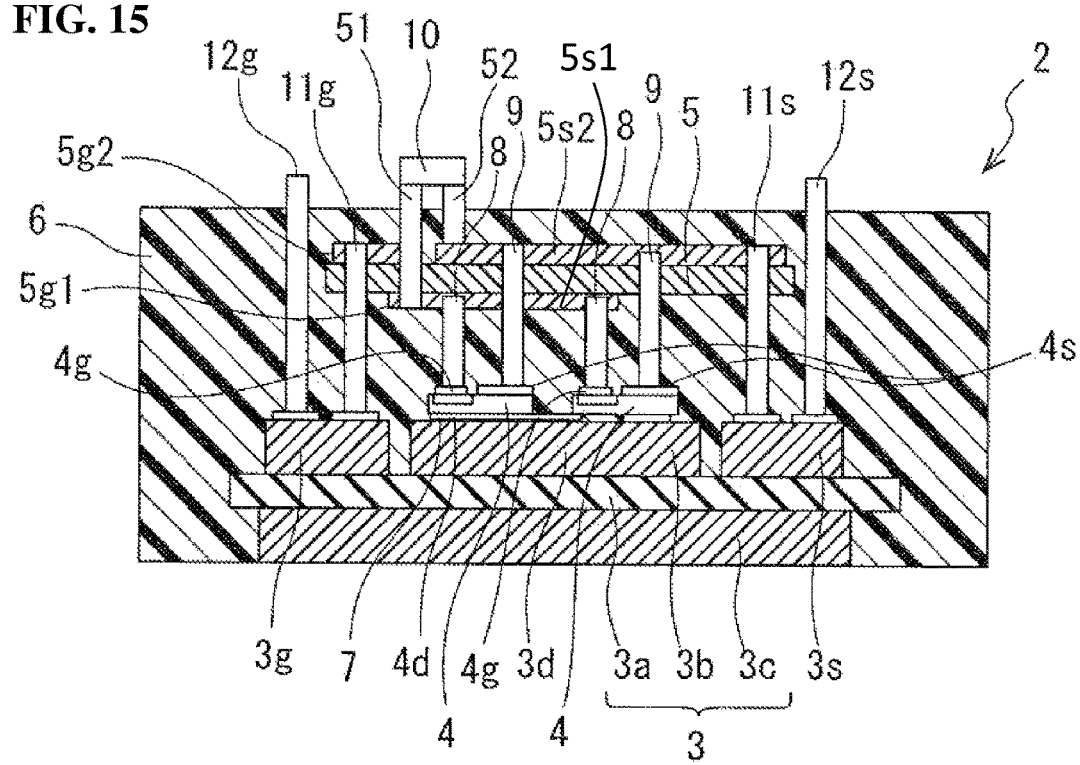
FIG. 15 is a cross-sectional view illustrating a main portion of a sixth embodiment of the semiconductor device according to the invention.

In the sixth embodiment, as illustrated in FIG. 15, a third conductive post 51 which is electrically and mechanically connected to the first metal layer 5g1 or 5g2 of the printed circuit board in the structure according to the first embodiment illustrated in FIG. 1. In addition, a fourth conductive post 52 is provided so as to be electrically and mechanically connected to the second metal layer 5s1 or 5s2 of the printed circuit board. The third conductive post 51 and the fourth conductive post 52 are arranged adjacent to each other. The third conductive post 51 and the fourth conductive post 52 protrude from the insulating resin 6 and the capacitor 10 is electrically and mechanically connected between the protruding portions. In FIG. 15, an external terminal for a drain is not illustrated.

In this embodiment, an equivalent circuit is the same as that in the above-described embodiments and it is possible to obtain the same effect as that in the above-described embodiments.

In the sixth embodiment, the mounting position of the capacitor 10 can be adjusted to any position where the first metal layer and the second metal layer are adjacent to each other. Therefore, it is possible to increase flexibility in the design of the power semiconductor module 2, as compared to the fifth embodiment.

Figure 16:
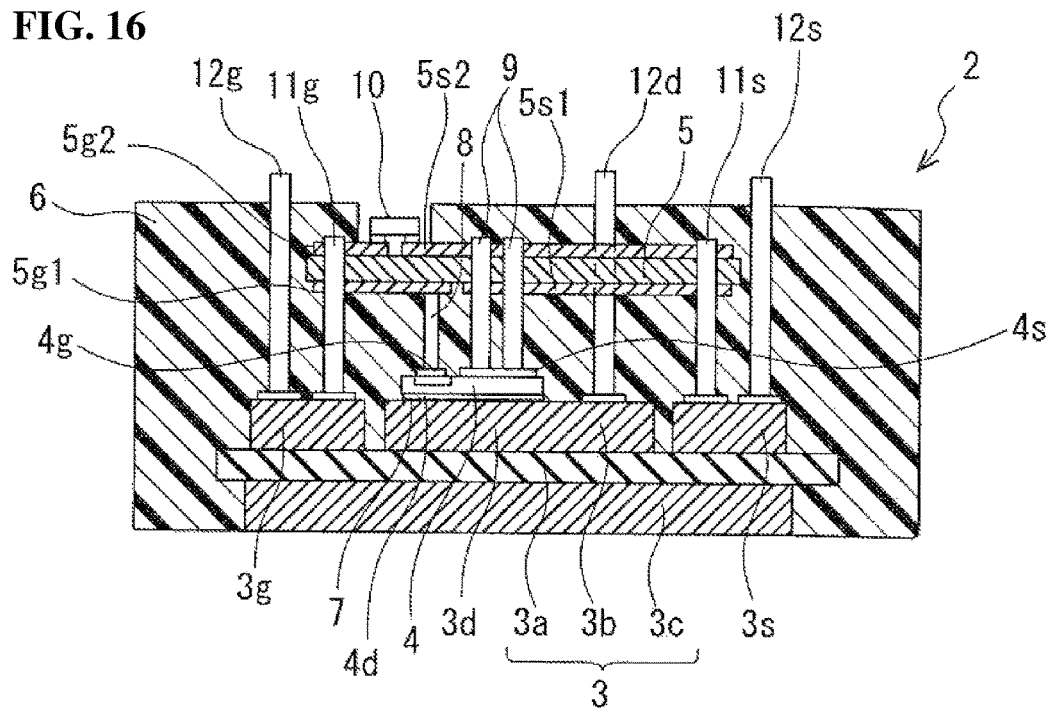
FIG. 16 is a cross-sectional view illustrating a main portion of a seventh embodiment of the semiconductor device according to the invention.

Next, a seventh embodiment of the invention will be described with reference to FIG. 16.

In the seventh embodiment, an arbitrary position where the first metal layer 5g2 for a gate and the second metal layer 5s2 for a source are adjacent to each other is exposed from the insulating resin 6 in the structure according to the first embodiment illustrated in FIG. 1. The capacitor 10 is electrically and mechanically connected between the exposed first metal layer 5g2 and the exposed second metal layer 5s2.

In this embodiment, an equivalent circuit is the same as that in the above-described embodiments and it is possible to obtain the same effect as that in the above-described embodiments.

In the seventh embodiment, the capacitor 10 can be arranged without protruding from the insulating resin. Therefore, it is possible to reduce the size of the power semiconductor module 2, as compared to the sixth embodiment.

In the fifth to seventh embodiments, the manufacturer provides the power semiconductor module to the user, with a circuit impedance reducing element, such as a capacitor, connected to the power semiconductor module in advance. However, in some cases, the user wants to customize the circuit impedance reducing element to suit the user's needs. Therefore, the manufacturer may provide the semiconductor module including an element connection terminal for connecting the circuit impedance reducing element between the gate electrode and the source electrode through the first conductive post and second conductive post to the user, without connecting the circuit impedance reducing element to the semiconductor module.

The element connection terminal corresponds to the first conductive post 8 and the second conductive post 9 in the fifth embodiment, corresponds to the third conductive post 51 and the fourth conductive post 52 in the sixth embodiment, and corresponds to the first metal layer 5g2 and second metal layer 5s2 exposed from the insulating resin 6 in the seventh embodiment.

The user who uses the power semiconductor module 2 electrically connects a circuit impedance reducing element with specification corresponding to the user's purpose to the element connection terminal. Therefore, it is possible to obtain the same effect as that in the above-described embodiments.

In the invention, a desired circuit structure can be obtained only by a combination of the connection terminals of the power semiconductor module. The invention is not limited to the above-mentioned inverter apparatus for power conversion. For example, the invention can be applied to other power conversion apparatuses using the power semiconductor module and other semiconductor devices, such as high-frequency switching ICs.

EXPLANATIONS OF LETTERS OR NUMERALS

2, PM POWER SEMICONDUCTOR MODULE
3, 3A, 3B INSULATING SUBSTRATE
3a INSULATING PLATE
3b, 14 CIRCUIT PLATE
3c METAL PLATE
4 SEMICONDUCTOR CHIP
4d DRAIN ELECTRODE
4s SOURCE ELECTRODE
4g GATE ELECTRODE
4A FIRST SEMICONDUCTOR CHIP
4B SECOND SEMICONDUCTOR CHIP
5 PRINTED CIRCUIT BOARD
5g1, 5g2 FIRST METAL LAYER
5s1, 5s2 SECOND METAL LAYER
6 INSULATING RESIN
7 BONDING MATERIAL
8 FIRST CONDUCTIVE POST
9 SECOND CONDUCTIVE POST
10, 10A, 10B CAPACITOR
11s, 11g CONDUCTIVE POST
12d, 12s, 12g EXTERNAL TERMINAL
13A LOWER ARM PORTION
13B UPPER ARM PORTION
16a, 16b SECOND METAL LAYER
16c, 16d FIRST METAL LAYER
17a, 17b CONDUCTIVE POST
17g FIRST CONDUCTIVE POST
17s SECOND CONDUCTIVE POST
18, 19, 20, 21a, 21b, 22a, 22b EXTERNAL TERMINAL
24 INSULATING RESIN
51 THIRD CONDUCTIVE POST
52 FOURTH CONDUCTIVE POST

What is claimed is:

1. A semiconductor device comprising:
an insulating substrate including an insulating plate and a circuit plate;
a semiconductor chip including a front surface having a gate electrode and a source electrode, and a rear surface fixed to the circuit plate;
a printed circuit board facing the insulating substrate, and including a first metal layer and a second metal layer;
a first conductive post having two ends electrically and mechanically connected to the gate electrode and the first metal layer;
a second conductive post having two ends electrically and mechanically connected to the source electrode and the second metal layer;
a circuit impedance reducing element disposed above the printed circuit board and electrically connected between the gate electrode and the source electrode through the first conductive post and the second conductive post; and
an insulating resin entirely covering the semiconductor chip, the circuit plate, and above and below of the printed circuit board except for the circuit impedance reducing element disposed above the printed circuit board.

2. The semiconductor device according to claim 1, wherein the circuit impedance reducing element is electrically connected through the first metal layer and the second metal layer.

3. The semiconductor device according to claim 2, wherein the circuit impedance reducing element is electrically and mechanically connected to surfaces of the first metal layer and the second metal layer.

4. The semiconductor device according to claim 3, wherein the insulating resin does not cover a portion of the first metal layer and a portion of the second metal layer of the printed circuit board, and
the circuit impedance reducing element is electrically and mechanically connected to the portions of the first metal layer and the second metal layer which are not covered with the insulating resin.

5. The semiconductor device according to claim 2, further comprising:
a third conductive post electrically and mechanically connected to the first metal layer; and
a fourth conductive post electrically and mechanically connected to the second metal layer,
wherein the third and fourth conductive posts go through the insulating resin, and
the circuit impedance reducing element is electrically and mechanically connected between the third conductive post and the fourth conductive post above the insulating resin.

6. The semiconductor device according to claim 5,
wherein the third conductive post and the fourth conductive post protrude from the insulating resin, and
the circuit impedance reducing element is electrically and mechanically connected between the protruding third and fourth conductive posts.

7. The semiconductor device according to claim 1, wherein first and second conductive pasts go through the insulating resin, and
the circuit impedance reducing element is electrically and mechanically connected between the first conductive post and the second conductive post above the insulating resin.

8. The semiconductor device according to claim 7,
wherein the first conductive post and the second conductive post protrude from the insulating resin, and
the circuit impedance reducing element is electrically and mechanically connected between the protruding first and second conductive posts.

9. The semiconductor device according to claim 1, wherein the circuit impedance reducing element is electrically and mechanically connected to a position where inductance of a line from the gate electrode of the semiconductor chip is equal to or less than 5 nH.

10. The semiconductor device according to claim 1, wherein the circuit impedance reducing element is one element selected from the group consisting a capacitor, a diode, or a MOSFET.

11. The semiconductor device according to claim 1, wherein the semiconductor chip includes a plurality of semiconductor devices, and
the circuit impedance reducing element includes a plurality of circuit impedance reducing devices.

12. The semiconductor device according to claim 1, wherein the semiconductor chip includes a plurality of semiconductor devices forming an upper arm portion and a lower arm portion, and
the circuit impedance reducing element is electrically connected to the semiconductor device forming the upper arm portion or the semiconductor device forming the lower arm portion.

13. The semiconductor device according to claim 1, wherein the semiconductor chip is a power semiconductor element having a drain electrode on the rear surface, and
the drain electrode is electrically connected to the circuit plate.

14. The semiconductor device according to claim 1, wherein the insulating resin include a portion, on the printed circuit board, where the insulating resin is not disposed, in which the circuit impedance reducing element is disposed.

15. A semiconductor device comprising:
an insulating substrate including an insulating plate and a circuit plate;
a semiconductor chip including a front surface having a gate electrode and a source electrode, and a rear surface fixed to the circuit plate;
a printed circuit board facing the insulating substrate, and including a first metal layer and a second metal layer;
a first conductive post having two ends electrically and mechanically connected to the gate electrode and the first metal layer;
a second conductive post having two ends electrically and mechanically connected to the source electrode and the second metal layer;
a circuit impedance reducing element disposed above the printed circuit board;
an element connection terminal to connect the circuit impedance reducing element between the gate electrode and the source electrode through the first conductive post and the second conductive post; and
an insulating resin entirely covering the semiconductor chip, the circuit plate, and above and below of the printed circuit board except for the circuit impedance reducing element disposed above the printed circuit board.

16. The semiconductor device according to claim 15, wherein the circuit impedance reducing element is one element selected from the group consisting of a capacitor, a diode, or a MOSFET.

* * * * *

UNITED STATES PATENT AND TRADEMARK OFFICE
CERTIFICATE OF CORRECTION

PATENT NO. : 10,163,868 B2
APPLICATION NO. : 14/877445
DATED : December 25, 2018
INVENTOR(S) : Masafumi Horio et al.

Page 1 of 1

It is certified that error appears in the above-identified patent and that said Letters Patent is hereby corrected as shown below:

In the Specification

Please change Column 5, Line 25, from "… second conductive post" to --… second conductive post 9--.

Please change Column 6, Line 56, from "diode Dig in …" to --diode Di2 in …--.

Please change Column 13, Line 20, from "… voltage with (=-9 V)" to --… voltage Vth (=-9 V)--.

Signed and Sealed this
Fifth Day of March, 2019

Andrei Iancu
*Director of the United States Patent and Trademark Office*